United States Patent
Nagase et al.

(10) Patent No.: US 10,707,269 B2
(45) Date of Patent: Jul. 7, 2020

(54) SEMICONDUCTOR STORAGE DEVICE

(71) Applicant: TOSHIBA MEMORY CORPORATION, Minato-ku, Tokyo (JP)

(72) Inventors: Toshihiko Nagase, Kuwana Mie (JP); Daisuke Watanabe, Yokkaichi Mie (JP); Koji Ueda, Kawasaki Kanagawa (JP); Tadashi Kai, Yokohama Kanagawa (JP); Kazumasa Sunouchi, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/352,680

(22) Filed: Mar. 13, 2019

(65) Prior Publication Data
US 2020/0083285 A1      Mar. 12, 2020

(30) Foreign Application Priority Data

Sep. 6, 2018    (JP) ................................ 2018-167218

(51) Int. Cl.
*H01L 27/22*   (2006.01)
*H01L 43/02*   (2006.01)
(Continued)

(52) U.S. Cl.
CPC .......... *H01L 27/224* (2013.01); *G11C 11/161* (2013.01); *H01F 10/3254* (2013.01);
(Continued)

(58) Field of Classification Search
CPC ....... H01L 27/224; H01L 43/02; H01L 43/12; H01L 45/141; H01L 45/146;
(Continued)

(56) References Cited

U.S. PATENT DOCUMENTS

| | | | |
|---|---|---|---|
| 7,663,171 B2 | 2/2010 | Inokuchi et al. | |
| 8,183,652 B2 * | 5/2012 | Ranjan .................... | B82Y 10/00 257/421 |
| 8,374,025 B1 * | 2/2013 | Ranjan .................... | H01L 43/10 365/171 |

(Continued)

FOREIGN PATENT DOCUMENTS

| | | |
|---|---|---|
| JP | 2006269530 A | 10/2006 |
| JP | 2011119532 A | 6/2011 |
| JP | 2011204814 A | 10/2011 |

OTHER PUBLICATIONS

Sasaki, et al., "Co—Pt—Cr—CoSi—CoO Sintered Target for Low Ar-gas-pressure Deposition of CoPtCr—SiO Granular Film with Stoichiometric SiO Phase", Transactions of Magnetics, Dec. 12, 2013, vol. 49, Issue 12, pp. 5603-5609.

(Continued)

*Primary Examiner* — David Vu
(74) *Attorney, Agent, or Firm* — Holtz, Holtz & Volek PC

(57) ABSTRACT

According to one embodiment, a semiconductor storage device includes: a first memory cell and a second memory cell, each including a switching element and a resistance change element coupled to the switching element, and the first memory cell and the second memory cell being adjacent to each other; a non-active member having a switching function between the switching element of the first memory cell and the switching element of the second memory cell; and an insulator which covers at least one of an upper surface or a lower surface of the non-active member, a side surface of the non-active member, a side surface of the switching element of the first memory cell, and a side surface of the switching element of the second memory cell.

19 Claims, 21 Drawing Sheets

(51) Int. Cl.
| | |
|---|---|
| *G11C 11/16* | (2006.01) |
| *H01F 10/32* | (2006.01) |
| *H01L 43/12* | (2006.01) |
| *H01F 41/34* | (2006.01) |
| *H01L 45/00* | (2006.01) |
| *H01L 43/10* | (2006.01) |

(52) U.S. Cl.
CPC ............ *H01F 41/34* (2013.01); *H01L 43/02* (2013.01); *H01L 43/12* (2013.01); *H01F 10/329* (2013.01); *H01F 10/3286* (2013.01); *H01L 43/10* (2013.01); *H01L 45/1233* (2013.01); *H01L 45/141* (2013.01); *H01L 45/146* (2013.01)

(58) Field of Classification Search
CPC ... H01L 45/1233; H01L 43/10; G11C 11/161; H01F 41/34; H01F 10/3254; H01F 10/329; H01F 10/3286
See application file for complete search history.

(56) References Cited

U.S. PATENT DOCUMENTS

| | | |
|---|---|---|
| 8,481,988 B2 | 7/2013 | Sonehara |
| 8,507,887 B2 | 8/2013 | Sonehara et al. |

OTHER PUBLICATIONS

N. Sasao, et al., "Single-Nanometer-Scale Patterning Technologies Applying Self-Assembling Materials," Toshiba Review, vol. 68, No. 8, 2016, pp. 31-34.

Masaaki Futamoto, et al., "Local Compositional Analysis of Magnetic Crystal Grain and Boundary in CoCrPt—SiO2 Granular Perpendicular Recording Media," International Conference on Magnetism (ICM 2009), Journal of Physics: Conference Series 200 (2010), Oct. 2001, 4 Pages.

Shi-Bing Qian, et al., "Plasma-Assisted Atomic Layer Deposition of High-Density Ni Nanoparticles for Amorphous In—Ga—Zn—O Thin Film Transistor Memory," Nanoscale Research Letters (2017) 12:138, 7 Pages.

\* cited by examiner

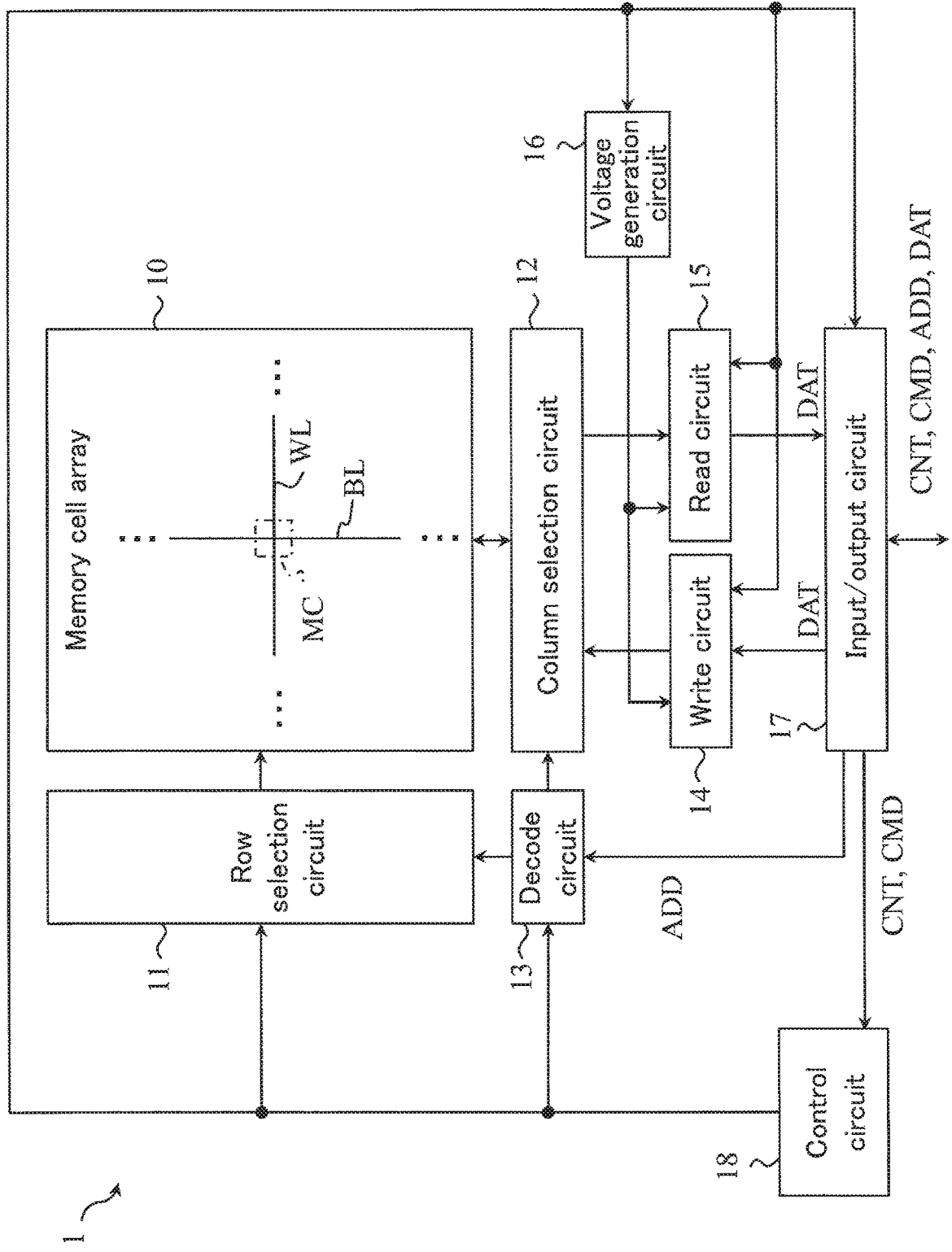
F I G. 1

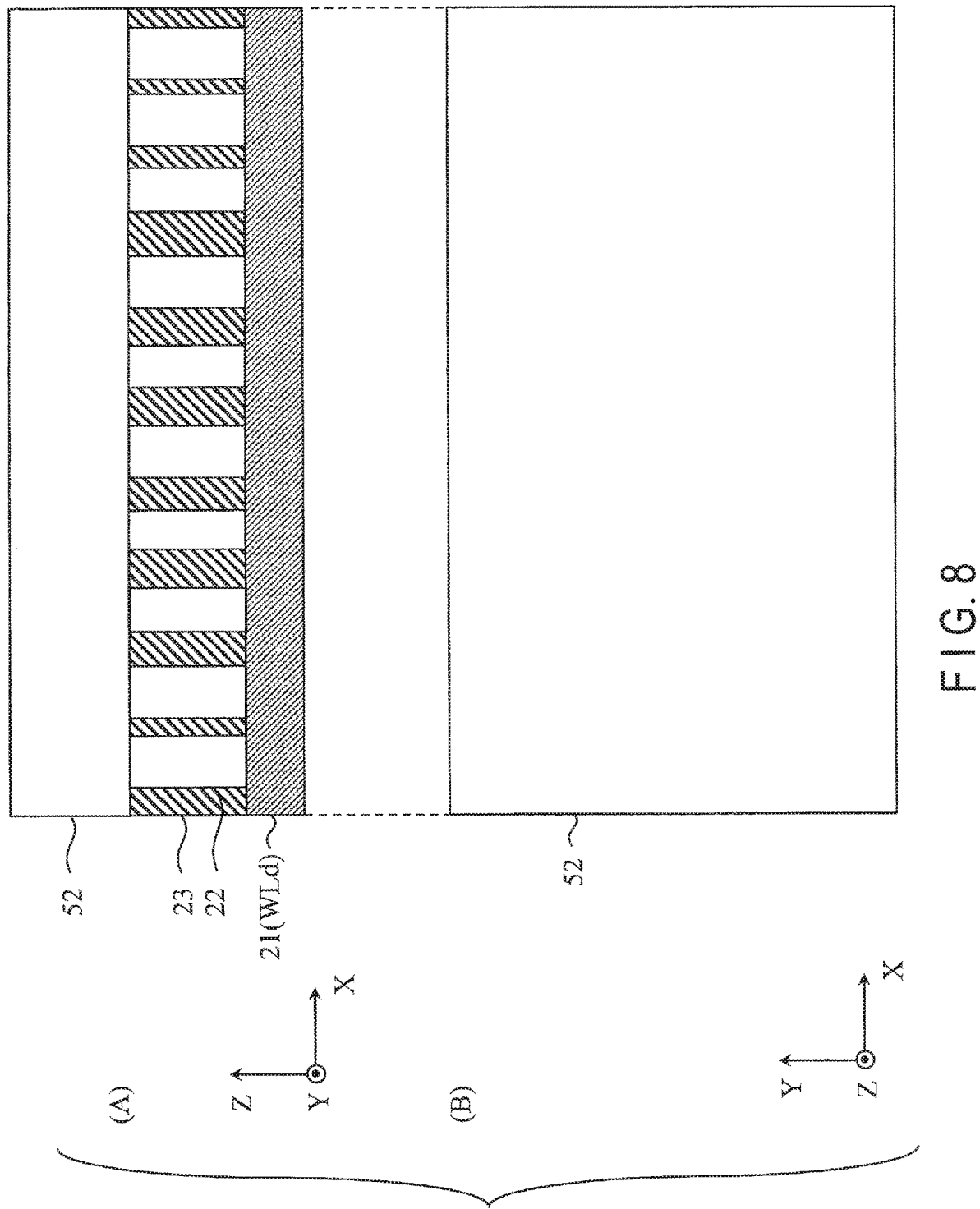
F I G. 8

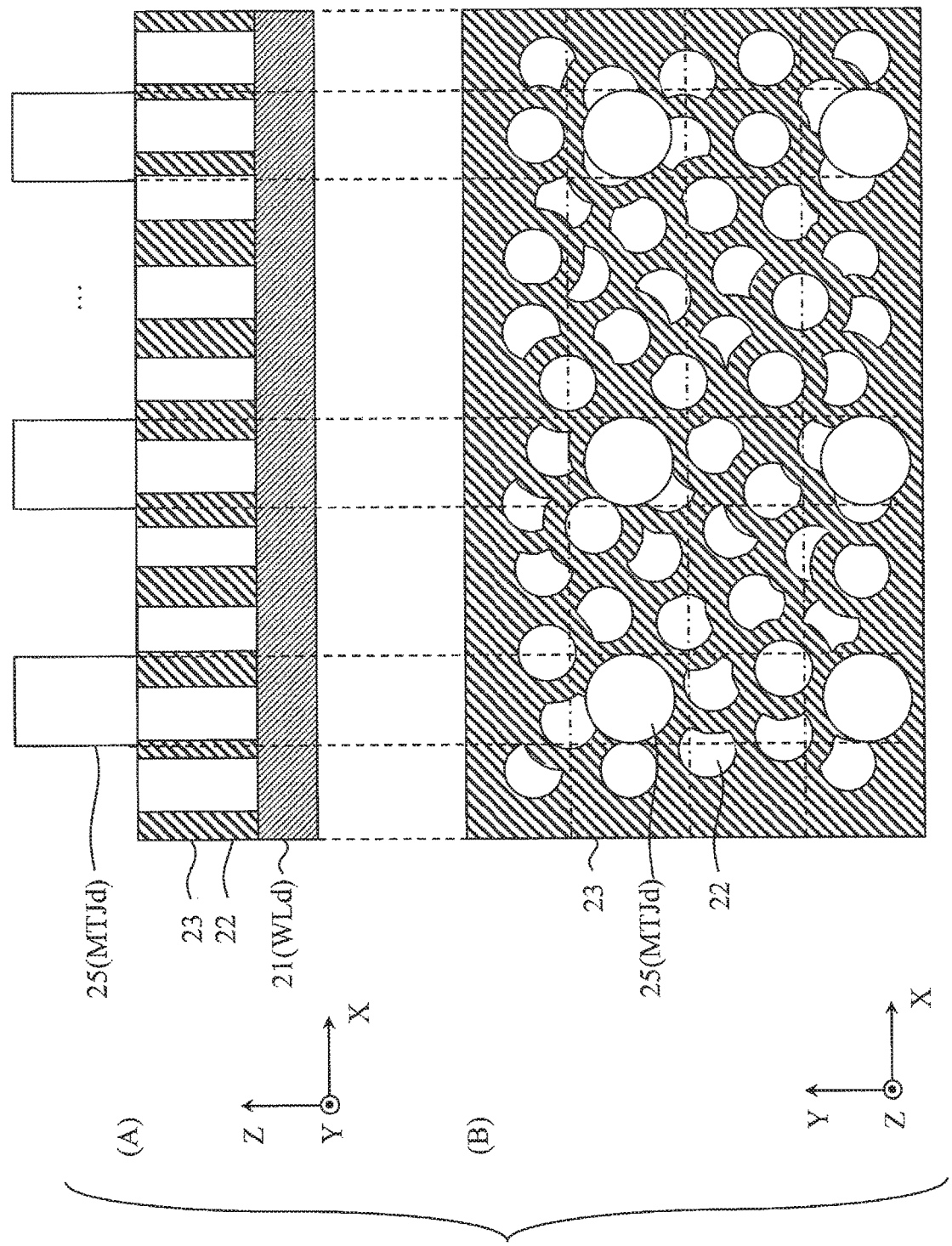
F I G. 9

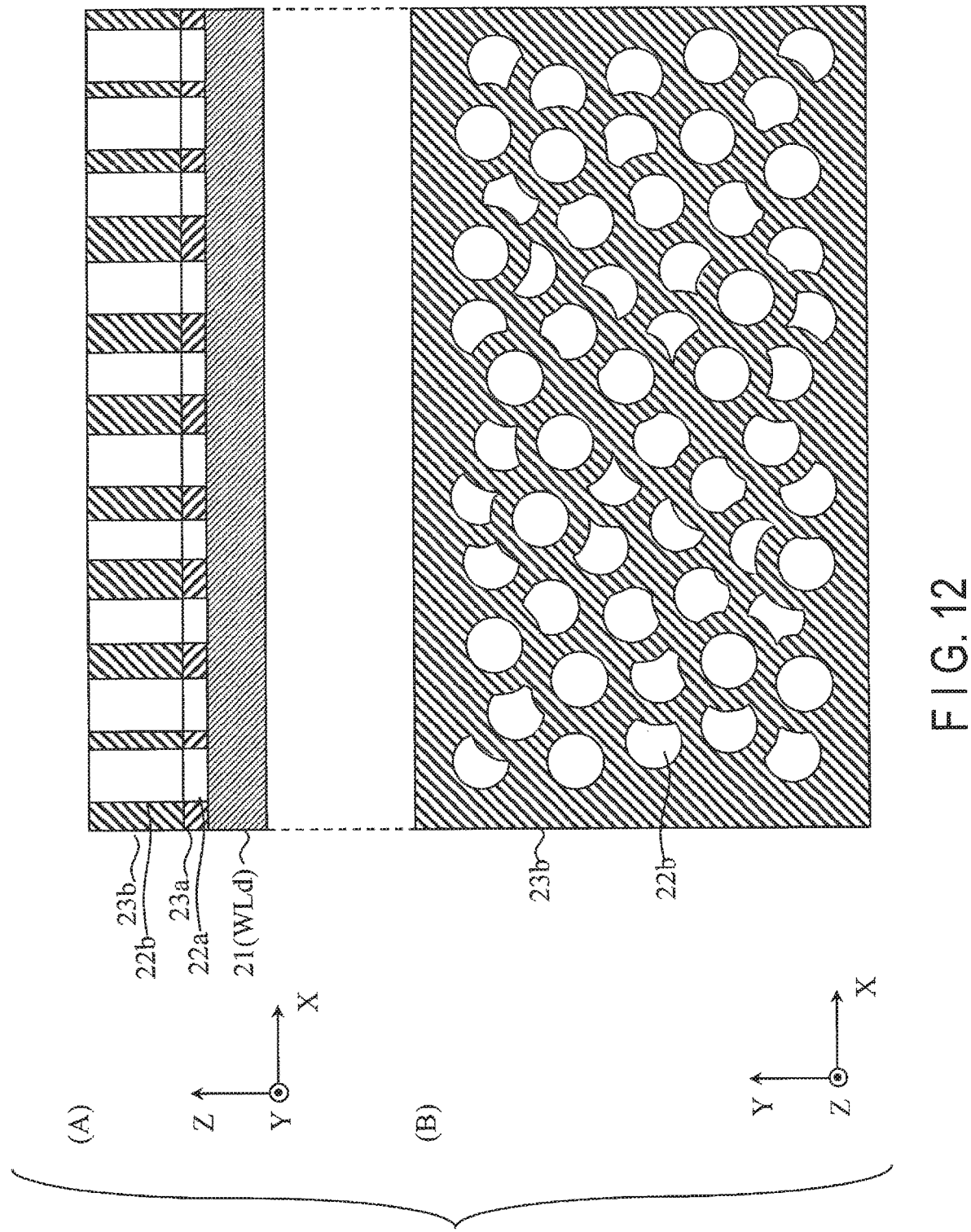
F I G. 12

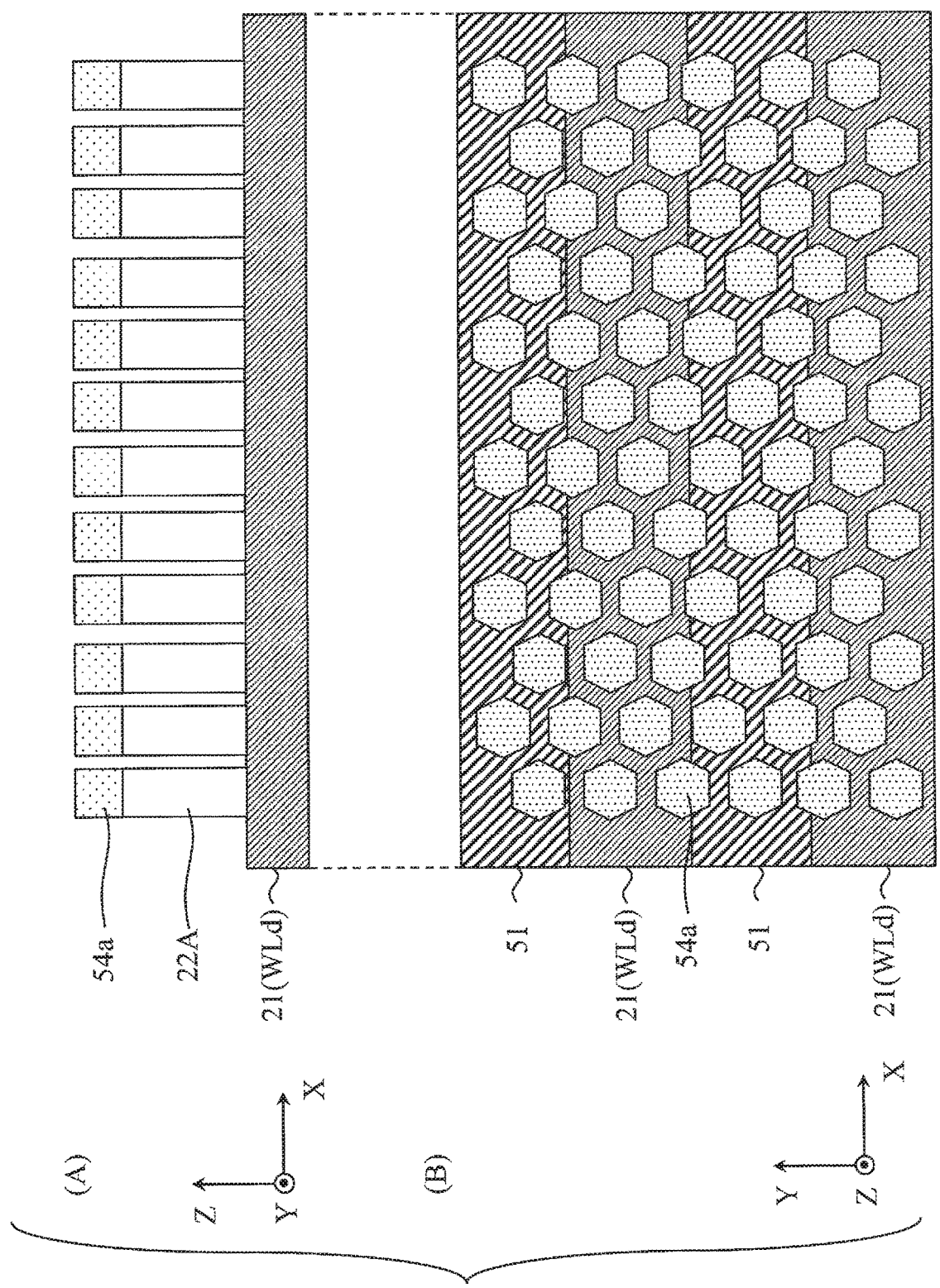
F I G. 17

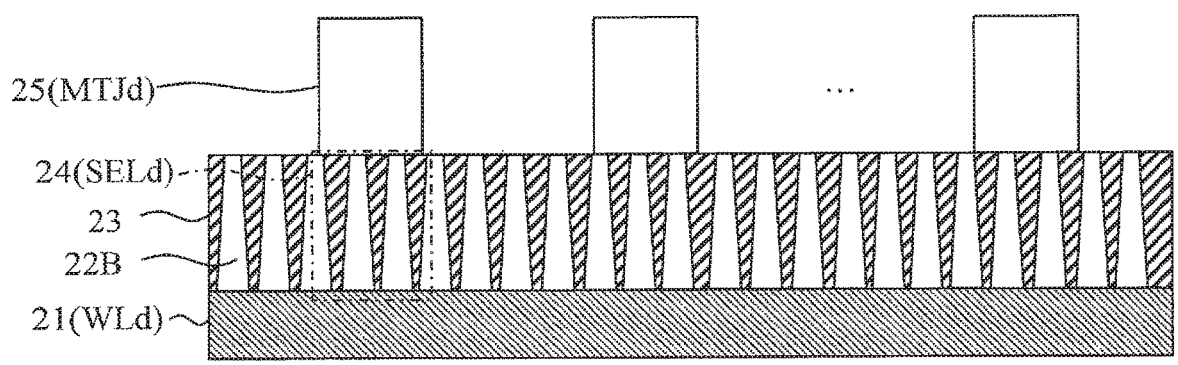
F I G. 19
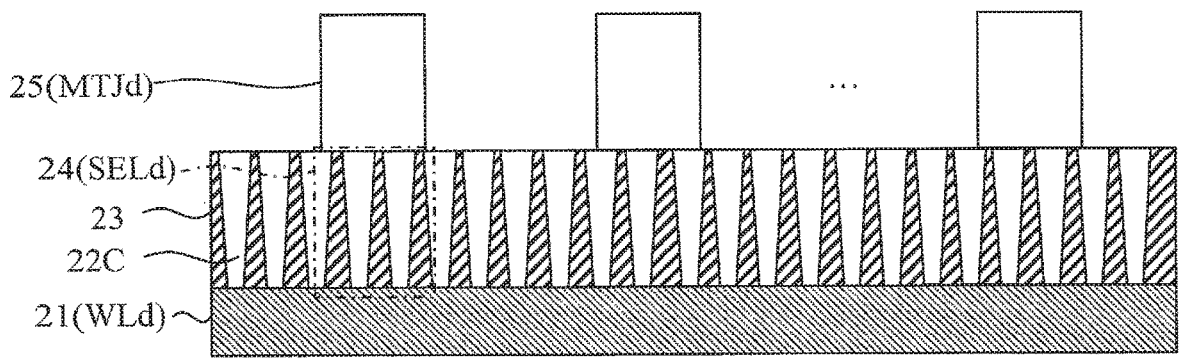
F I G. 20
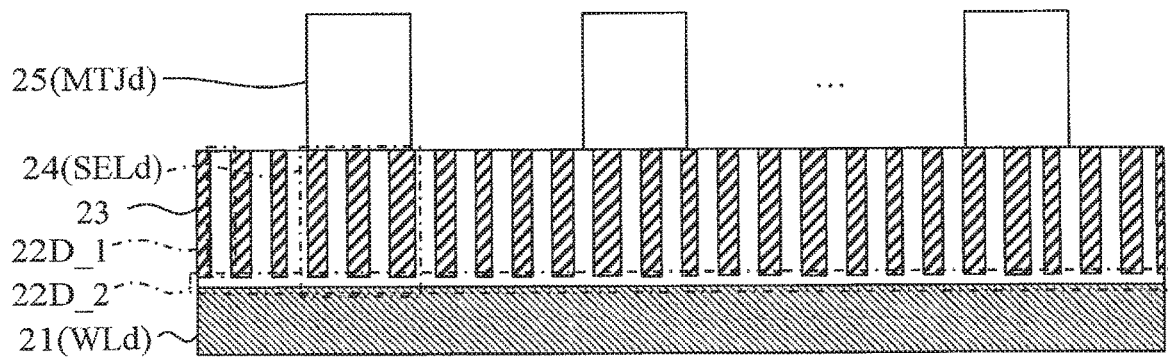
F I G. 21

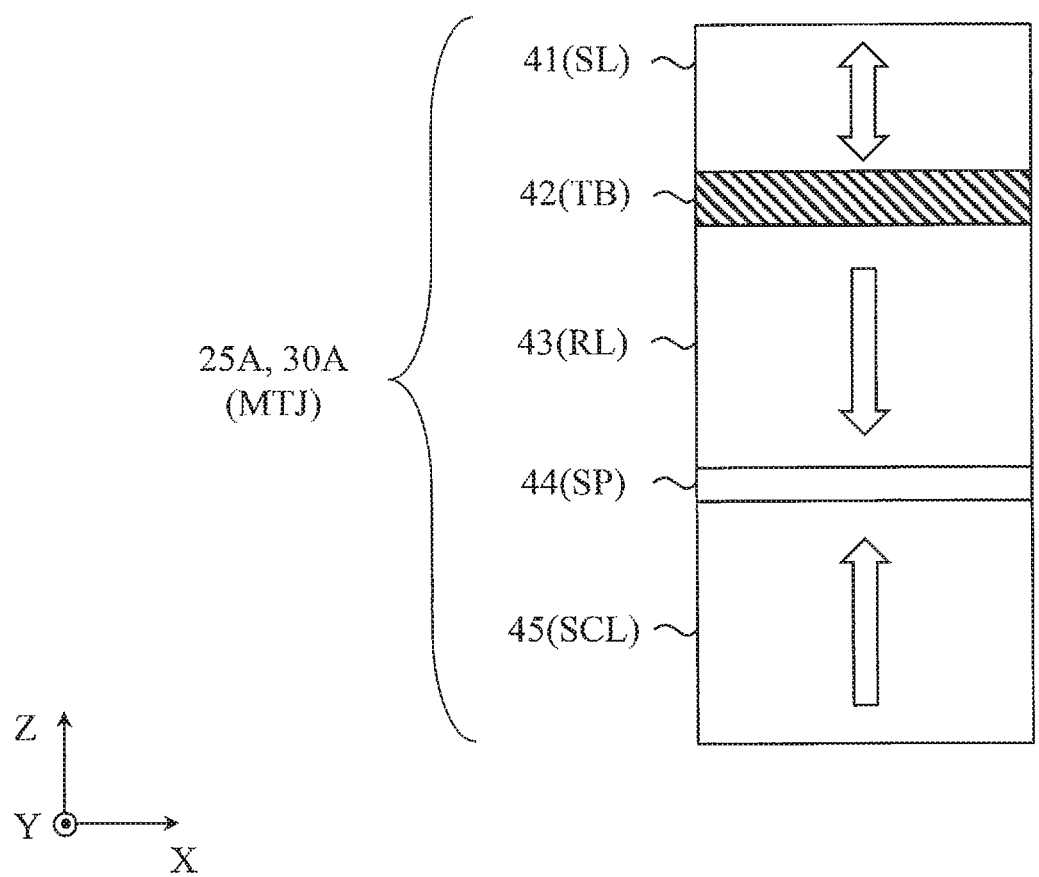
F I G. 22

SEMICONDUCTOR STORAGE DEVICE

CROSS-REFERENCE TO RELATED APPLICATIONS

This application is based upon and claims the benefit of priority from Japanese Patent Application No. 2018-167218, filed Sep. 6, 2018; the entire contents of which are incorporated herein by reference.

FIELD

Embodiments described herein relate generally to a semiconductor storage device.

BACKGROUND

A semiconductor storage device using resistance change elements is known.

BRIEF DESCRIPTION OF THE DRAWINGS

FIG. 1 is a block diagram illustrating a configuration of a magnetic storage device according to a first embodiment.

FIG. 8 is a schematic view illustrating a method of manufacturing the memory cell array of the magnetic storage device according to the first embodiment.

FIG. 9 is a schematic view illustrating a method of manufacturing the memory cell array of the magnetic storage device according to the first embodiment.

FIG. 12 is a schematic view illustrating a method of manufacturing the memory cell array of the magnetic storage device according to the modification of the first embodiment.

FIG. 17 is a schematic view illustrating a method of manufacturing the memory cell array of the magnetic storage device according to the second embodiment.

FIG. 19 is a cross-sectional view illustrating a configuration of a memory cell array of a magnetic storage device according to a first modification.

FIG. 20 is a cross-sectional view illustrating another configuration of the memory cell array of the magnetic storage device according to the first modification.

FIG. 21 is a cross-sectional view illustrating a configuration of a memory cell array of a magnetic storage device according to a second modification.

FIG. 22 is a cross-sectional view illustrating a configuration of a magnetoresistive effect element of a magnetic storage device according to a third modification.

DETAILED DESCRIPTION

Figure 2:
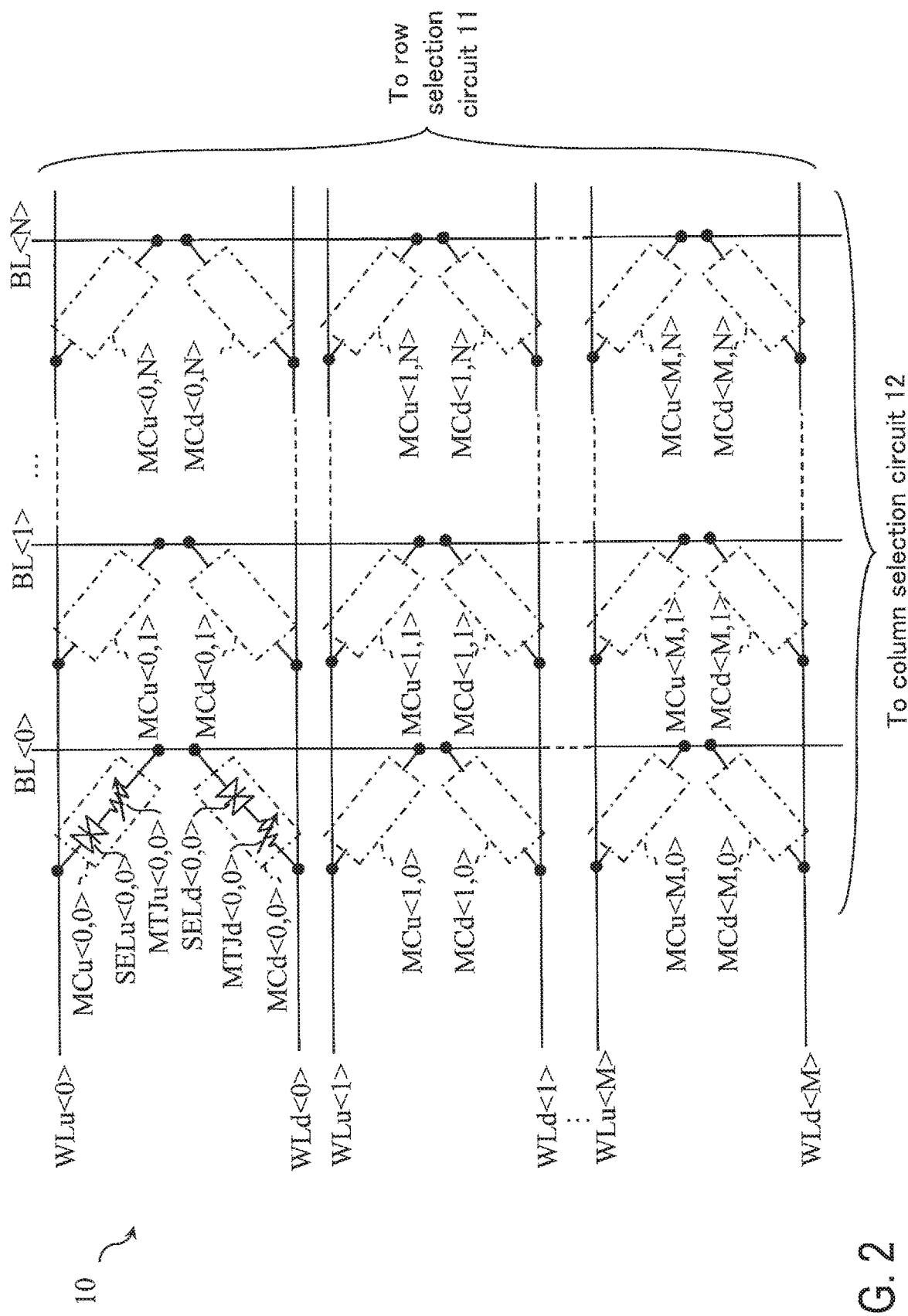
FIG. 2 is a circuit diagram illustrating the configuration of a memory cell array of the magnetic storage device according to the first embodiment.

In general, according to one embodiment, a semiconductor storage device includes: a first memory cell and a second memory cell, each including a switching element and a resistance change element coupled to the switching element, and the first memory cell and the second memory cell being adjacent to each other; a non-active member having a switching function between the switching element of the first memory cell and the switching element of the second memory cell; and an insulator which covers at least one of an upper surface or a lower surface of the non-active member, a side surface of the non-active member, a side surface of the switching element of the first memory cell, and a side surface of the switching element of the second memory cell.

Hereinafter, embodiments will be described with reference to the drawings. In the explanations below, structural elements having similar functions and configurations will be denoted by the same reference symbols. If it is necessary to distinguish the structural elements having the same reference symbols from each other, an additional symbol is added after the reference symbol. If it is unnecessary to distinguish the structural elements, only a common reference symbol is assigned to the structural elements, and no additional symbol is added. Herein, additional symbols are not limited to subscripts or superscripts, and they may be, for example, lower-case alphabetical letters added to references symbols, and indices meaning arrangement, etc.

1. First Embodiment

A semiconductor storage device according to a first embodiment will be described. The semiconductor storage device according to the first embodiment is, for example, a perpendicular magnetization-type magnetic storage device in which an element having a magnetoresistive effect provided by a magnetic tunnel junction (MTJ) (such an element may be called an MTJ element or a magnetoresistive effect element) as a resistance change element.

1.1 Configuration

First, a configuration of the magnetic storage device according to the first embodiment will be described.

1.1.1 Configuration of Magnetic Storage Device

FIG. 1 is a block diagram illustrating a configuration of the magnetic storage device according to the first embodiment. As illustrated in FIG. 1, the magnetic storage device 1 comprises a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC, each associated with a set of a row and a column. Memory cells MC arranged in the same row are coupled to the same word line WL, and memory cells MC arranged in the same column are coupled to the same bit line BL.

The row selection circuit 11 is coupled to the memory cell array 10 via word lines WL. To the row selection circuit 11, a decoding result of an address ADD provided from the decode circuit 13 (row address) is supplied. The row selection circuit 11 sets a word line WL corresponding to a row which is selected based on the decoding result of an address ADD to a selected state. Hereinafter, the word line WL that has been set to a selected state will be referred to as a selected word line WL. The word lines WL other than the selected word line WL will be referred to as non-selected word lines WL.

The column selection circuit 12 is coupled to the memory cell array 10 via bit lines BL. To the column selection circuit 12, a decoding result of an address ADD provided from the decode circuit 13 (column address) is supplied. The column selection circuit 12 sets a column which is selected based on the decoding result of an address ADD to a selected state. Hereinafter, the bit line BL that has been set to a selected state will be referred to as a selected bit line BL. The bit lines BL other than the selected bit line BL will be referred to as non-selected bit lines BL.

The decode circuit 13 decodes an address ADD from the input/output circuit 17. The decode circuit 13 supplies the decoding result of the address ADD to the row selection circuit 11 and the column selection circuit 12. The address ADD includes an address of a column to be selected and an address of a row to be selected.

The write circuit 14 writes data to a memory cell MC. The write circuit 14 includes, for example, a write driver (not shown).

The read circuit 15 reads data from a memory cell MC. The read circuit 15 includes, for example, a sense amplifier (not shown).

The voltage generation circuit 16 generates a voltage for various operations of the memory cell array 10 by using a power supply voltage provided outside (not shown) of the magnetic storage device 1. For example, the voltage generation circuit 16 generates various voltages required for a write operation, and outputs the voltages to the write circuit 14. The voltage generation circuit 16 also generates various voltages required for a read operation, and outputs the voltages to the read circuit 15.

The input/output circuit 17 transfers an address ADD provided outside of the magnetic storage device 1 to the decode circuit 13. The input/output circuit 17 transfers a command CMD provided outside of the magnetic storage device 1 to the control circuit 18. The input/output circuit 17 transmits and receives various control signals CNT between the outside of the magnetic storage device 1 and the control circuit 18. The input/output circuit 17 transfers data DAT provided outside of the magnetic storage device 1 to the write circuit 14, and outputs data DAT transferred from the read circuit 15 to the outside of the magnetic storage device 1.

The control circuit 18 controls the operations of the row selection circuit 11, the column selection circuit 12, the decode circuit 13, the write circuit 14, the read circuit 15, the voltage generation circuit 16, and the input/output circuit 17 in the magnetic storage device 1 based on a control signal CNT and a command CMD.

1.1.2 Configuration of Memory Cell Array

Next, a configuration of the memory cell of the magnetic storage device according to the first embodiment will be described with reference to FIG. 2. FIG. 2 is a circuit diagram showing a configuration of the memory cell array of the magnetic storage device according to the first embodiment. In FIG. 2, the word lines WL are classified by additional symbols such as two lower-case alphabets ("u" and "d") and index ("< >").

As shown in FIG. 2, the memory cells MC (MCu and MCd) are arranged in a matrix in the memory cell array 10, and are respectively associated with a set of one of a plurality of bit lines BL (BL<0>, BL<1>, ..., BL<N>) and one of a plurality of word lines WLd (WLd<0>, WLd<1>, ..., WLd<M>) or WLu<0>, WLu<1>, ..., WLu<M>) (M and N are any integers). In other words, memory cell MCd <i,j> ($0 \leq i \leq M$, $0 \leq j \leq N$) is coupled between word line WLd<i> and bit line BL<j>, and memory cell MCu<i,j> is coupled between word line WLu<i> and bit line BL<j>.

The additional symbols "d" and "u" are used to identify a memory cell provided below a bit line BL or above a bit line BL. An example of a three-dimensional configuration of the memory cell array 10 will be described later in detail.

Memory cell MCd<i,j> includes selector SELd<i,j> and magnetoresistive effect element MTJd<i,j> coupled in series thereto. Memory cell MCu<i,j> includes selector SELu<i,j> and magnetoresistive effect element MTJu<i,j> coupled in series thereto.

The selector SEL has a function as a switch that controls a supply of a current to a corresponding magnetoresistive effect element MTJ when data is written to and read from the magnetoresistive effect element MTJ. More specifically, the selector SEL in a memory cell MC, for example, serves as an insulator having a high resistance value and cuts off a current (in other words, is in an off state) when a voltage applied to the memory cell MC is below a threshold voltage Vth, and serves as a conductor having a low resistance value and allows a current to flow (in other words, is in an on state) when the voltage exceeds the threshold voltage Vth. In other words, the selector SEL has a function of switching between the on state and the off state in accordance with a voltage applied to a memory cell MC, irrespective of a direction of a flowing current.

The selector SEL may be a switching element between two terminals, for example. When a voltage applied between two terminals is smaller than a threshold voltage, the switching element is in a "high resistance" state, such as an electrically non-conductive state. When a voltage applied between two terminals is equal to or larger than a threshold voltage, the switching element is in a "low resistance" state, such as an electrically conductive state. The switching element may have this function regardless of the polarity of the voltage. For example, the switching element may include at least one type of chalcogen selected from a group of tellurium (Te), selenium (Se), and sulfur (S). Alternatively, the switching element may include chalcogenide, which is a compound containing the chalcogen element. This switching element may include at least one element selected from a group consisting of boron (B), aluminum (Al), gallium (Ga), indium (In), carbon (C), silicon (Si), germanium (Ge), tin (Sn), arsenic (As), phosphorus (P), antimony (Sb), titanium (Ti), and bismuth (Bi). More specifically, the switching element may include at least two elements selected from germanium (Ge), antimony (Sb), tellurium (Te), titanium (Ti), arsenic (As), indium (In), and bismuth (Bi). Furthermore, the switching element may include an oxide of at least one element selected from titanium (Ti), vanadium (V), chromium (Cr), niobium (Nb), molybdenum (Mo), hafnium (Hf), and tungsten (W).

A resistance value of a magnetoresistive effect element MTJ can be switched between a low-resistance state and a high-resistance state by a current of which the control is selected by a selector SEL. The magnetoresistive element MTJ is capable of writing data in accordance with the change of its resistance state, and stores written data in a non-volatile manner to function as a readable storage element.

Figure 3:
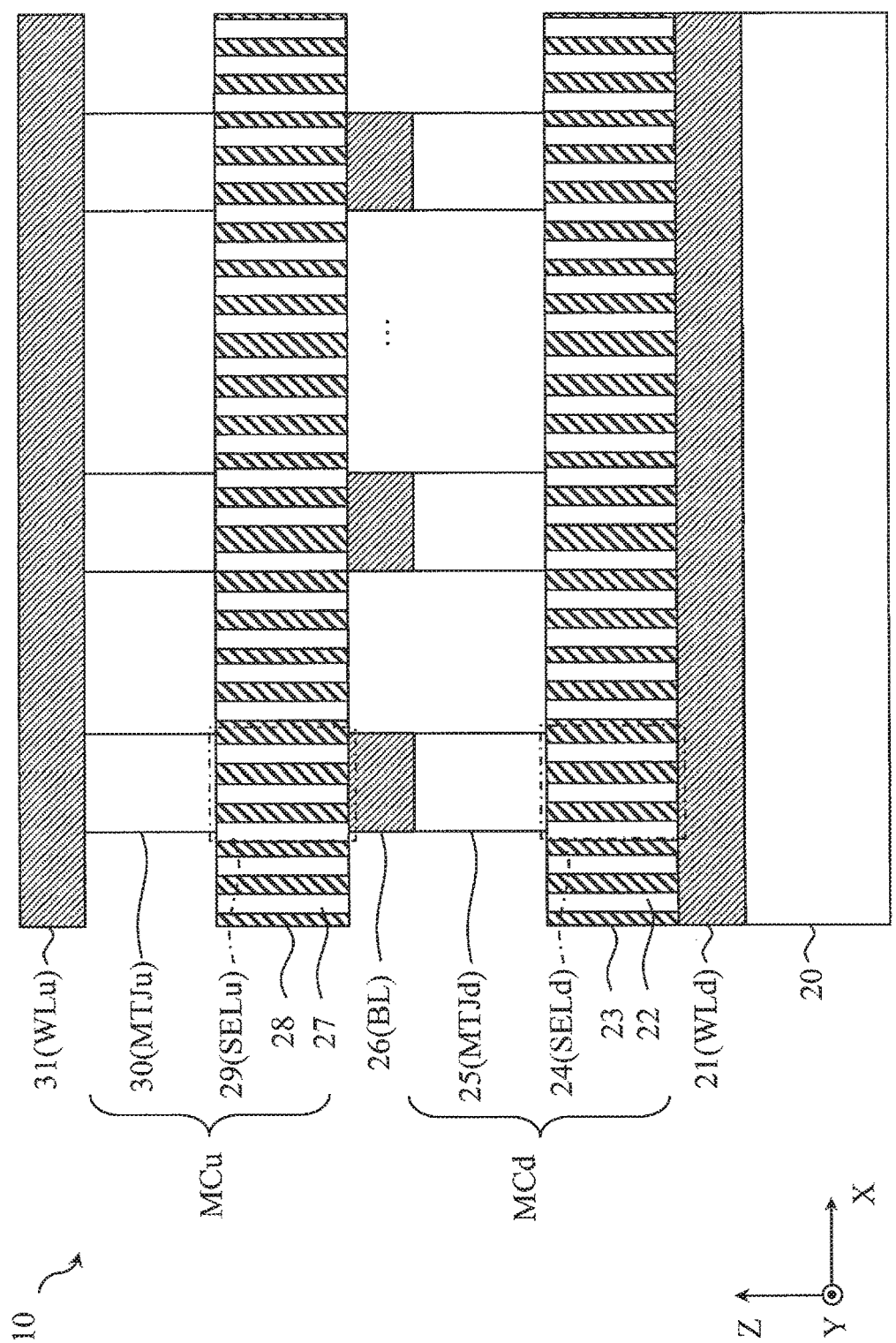
FIG. 3 is a cross-sectional view illustrating a configuration of the memory cell array of the magnetic storage device according to the first embodiment.

Next, the cross-section structure of the memory cell array 10 will be described with reference to FIG. 3. FIG. 3 shows an example of a cross-section structure of the memory cell array of the magnetic storage device according to the first embodiment, along the word lines.

As shown in FIG. 3, the memory cell array 10 is provided on the semiconductor substrate 20. In the following description, a plane parallel to the surface of the semiconductor substrate 20 is defined as an XY plane, and a direction perpendicular to the XY plane is defined as a Z direction. The direction along the word lines WL is defined as an X direction, and the direction along the bit lines BL is defined as a Y direction.

On the upper surface of the semiconductor substrate 20, a plurality of conductors 21 that serve as word lines WLd, for example, are provided. The plurality of conductors 21 are, for example, arranged in the Y direction alongside each other, each extending in the X direction. FIG. 3 shows one of the plurality of conductors 21. Between the conductors 21, a not-shown insulator, for example, is provided up to the same height as the plurality of conductors 21.

On the upper surfaces of the plurality of conductors 21 and of the not-shown insulator, a plurality of selector members 22 are formed across the XY plane. Each of the selector members 22 includes a material used for the above-described switching element between two terminals, and therefore has a function as a switch between two terminals. That is, the selector member is also referred to as a member having the switching function. Each of the selector members 22 is formed in a pillar shape along the Z direction, and an insulator 23 is formed on the side surface of each selector member. The insulator 23 includes, for example, silicon dioxide ($SiO_2$) or silicon nitride (SiN).

On the upper surfaces of the selector members 22 and of the insulator 23, a plurality elements 25 that function as magnetoresistive effect elements MTJd are provided. The plurality of elements 25 are, for example, arranged in line along and above each conductor 21. In other words, the plurality of elements 25 arranged in line along the X direction are coupled to one conductor 21 in common via at least one selector member 22. The diameter of each element 25 is larger than the diameter of the at least one selector member 22. For this reason, the upper surfaces of one or more selector members 22 may be arranged on the lower surface of one element 25, with the upper surfaces being contact with the lower surface. The one or more selector members 22 arranged on the lower surface of one element 25 with their upper surfaces being in contact with the lower surface may be regarded as one element 24 that functions as a selector SELd corresponding to one memory cell MC.

On the upper surface of each of the elements 25, a plurality of conductors 26 that function as bit lines BL are provided. The plurality of conductors 26 are, for example, arranged in the X direction alongside each other, each extending in the Y direction. In other words, the plurality of elements 25 arranged in line along the Y direction are coupled to one conductor 26 in common. On the side surfaces of the elements 25 and of the conductors 26, a not-shown insulator is provided, for example.

On the upper surfaces of the plurality of conductors 26 and of the not-shown insulator, a plurality of selector members 27 are formed across the XY plane. Each of the selector members 27 has a function as the above-described switching element between two terminals. Each of the selector members 27 is formed in a pillar shape along the Z direction, and an insulator 28 is formed on the side surface of each selector member. The selector members 27 have a function and configuration equivalent to those of the selector members 22, for example.

On the upper surfaces of the selector members 27 and of the insulator 28, a plurality of elements 30 that function as magnetoresistive effect elements MTJu are provided. The elements 30 have a function and configuration equivalent to those of the elements 25, for example. The plurality of elements 30 are arranged in line along and above each conductor 26, for example. In other words, the plurality of elements 30 arranged in line along the Y direction are coupled to one conductor 26 in common via the selector members 27. The diameter of each element 30 is larger than the diameter of the selector member 27. For this reason, the upper surfaces of the selector members 27 may be arranged on the lower surface of one element 30, with the upper surfaces being contact with the lower surface. The selector members 27 arranged on the lower surface of one element 30 with their upper surfaces being in contact with the lower surface may be regarded as one element 29 that functions as a selector SELu corresponding to one memory cell MC.

On the upper surface of each of the elements 30, a plurality of conductors 31 that function as word lines WLu are arranged. The plurality of conductors 31 are, for example, arranged in the Y direction alongside each other, each extending in the X direction. In other words, the plurality of elements 30 arranged in line in the X direction are coupled to one conductor 31 in common. On the side surfaces of the elements 30 and of the conductors 31, a not-shown insulator is provided, for example.

The memory cell 10 configured as described above has a structure in which a set of two word lines, WLd and WLu, corresponds to one bit line BL. Furthermore, the memory cell array 10 has a structure in which memory cells MCd are arranged between a word line WLd and a bit line BL and memory cells MCu are arranged between a bit line BL and a word line WLu in Z direction. In the structure illustrated in FIG. 3, the memory cells MCd are associated with the lower layer and the memory cell MCu are associated with the upper layer. In other words, of two memory cells MC coupled to one bit line BL in common, the memory cell MC provided in the upper layer of the bit line BL is referred to with the additional symbol "u", i.e., "memory cell MCu", and the other memory cell MC provided in the lower layer is referred to with "d", i.e., "memory cell MCd".

Figure 4:
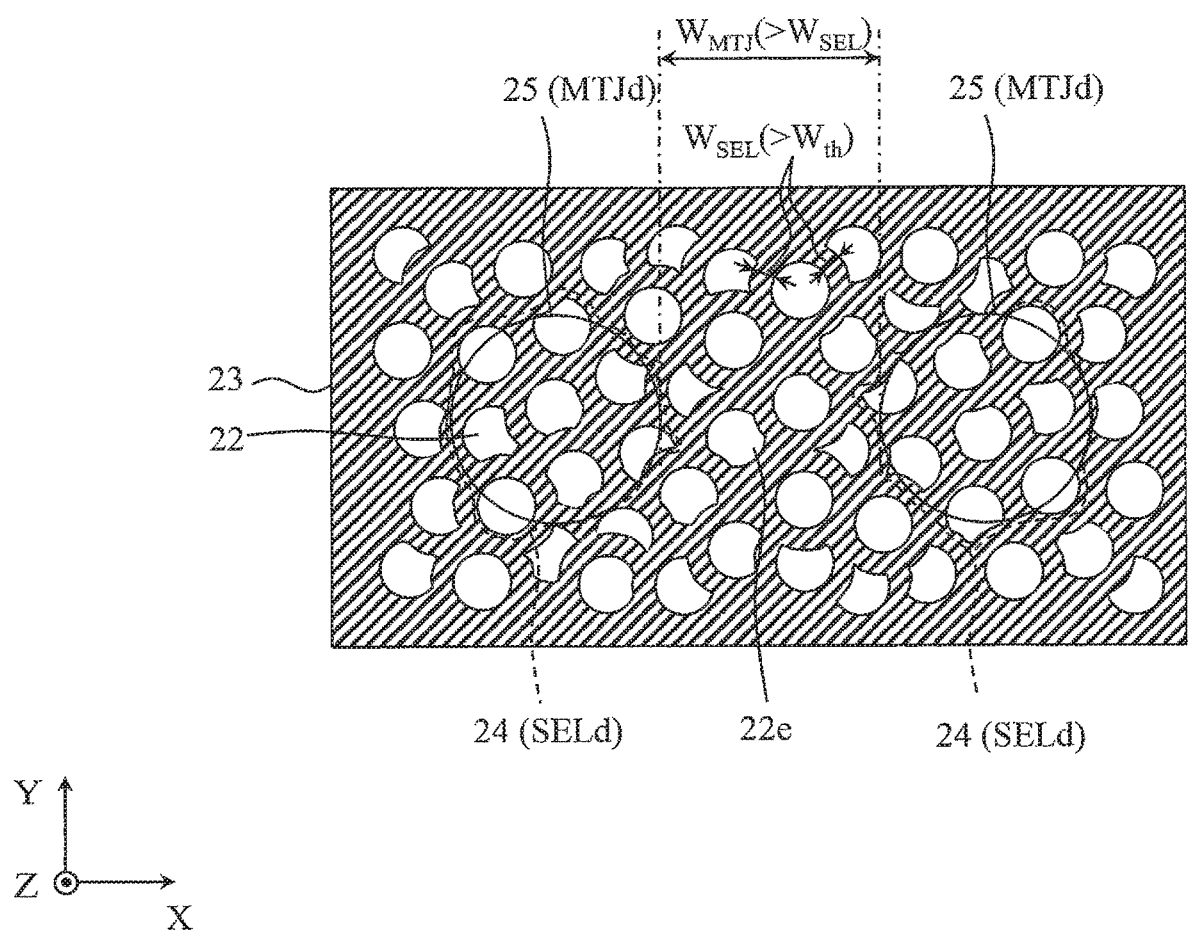
FIG. 4 is a plan view illustrating a configuration of the memory cell array of the magnetic storage device according to the first embodiment.

FIG. 4 is a plan view illustrating a configuration of the memory cell array of the magnetic storage device according to the first embodiment. FIG. 4 shows a coupling surface between the elements 24 and the elements 25, as well as the distribution of the plurality of selector members 22 within the XY plane in the coupling surface, and the relationship between each element 24 and each element 25. In FIG. 4, the cross section of each element 25 in the coupling surface is indicated by a solid line, and a range in which a plurality of selector members 22 therein function as a whole as one element 24 is indicated by a dashed line. Only the memory cells MCd will be described with reference to FIG. 4 for the convenience of explanation, but the memory cells MCu have a structure equivalent to the structure of the memory cells MCd. The description of the memory cells MCu will be omitted, accordingly.

As shown in FIG. 4, the selector members 22 are isolated from each other, with the insulator 23 being interposed therebetween. The selector members 22 are formed so that the width W between the selector members 22 is greater than at least a threshold $W_{th}$, and smaller than a width WMTJ of two neighboring elements 25. The threshold Wth is, for example, 1 nanometer, and can be set to any length as long as a current does not flow between the selector members 22 via the insulator 23 (in the direction along the XY plane).

Each element 25 has, for example, an approximately circular section along the coupling surface. In contrast, the cross section of each selector member 22 along the coupling surface is not limited to a circular shape, and may be any random shape. The cross-sectional area of each selector member 22 along the coupling surface is smaller than that of the element 25 along the coupling surface. For this reason, the upper surfaces of one or more selector members 22 are coupled in common to the lower surface of one element 25. Each of the one or more selector members 22 can function as a selector SELd if its upper surface is at least partially coupled to the element 25. In other words, the element 24 includes not only the selector member 22 of which its upper surface is entirely coupled to the element 25, but also the selector member 22 of which its upper surface is only partially coupled to the element 25.

The selector members 22 are arranged randomly across the XY plane. Accordingly, between two neighboring memory cells MC, there may be one or more selector members 22e not being coupled to any of the elements 25 in two neighboring memory cells MC. The side surfaces of the selector members 22e are covered with the insulator 23, similarly to the selector members 22 constituting the element 24. In the selector members 22e, at least one of the upper surfaces or the lower surfaces are covered with insulators (not shown). Thus, the selector members 22e are regarded as (non-active) selector members that do not function as a selector SEL, in contrast to the (active) selector members 22 that function as a selector SEL.

The elements 24 included in each of the two neighboring memory cells MC are electrically disconnected by the insulators 23, regardless of the presence/absence of the selector members 22e. For this reason, it is possible to suppress a leak of a current flowing in one of the memory cells MC to its neighboring memory cell MC when the current flows in the direction along the XY plane in the layer where the selector members 22 are formed.

In the examples shown in FIGS. 3 and 4, the conductors 21, the elements 24 and 25, the conductors 26, the elements 29 and 30, and the conductors 31 are arranged so as to be in contact with each other; however, the present embodiment is not limited to the examples. Those elements may be arranged with any other members being interposed therebetween. Other members include, for example, a base layer provided below a storage layer, or a lower electrode. In a case where the storage elements (the element 25 and element 30 in FIG. 3) are magnetoresistive effect elements MTJ, it is desirable, however, that a first end of each of the selector members in a selector SEL in one memory cell MC is electrically coupled to a storage layer of the magnetoresistive effect element MTJ with a mutually-independent conductive path, and that the first end is in contact with the storage layer of the magnetoresistive effect element MTJ in a mutually-independent manner. In addition, it is desirable that the part where the storage layer of the magnetoresistive effect element MTJ and each selector member are coupled to each other is smaller (narrower) than the cross-sectional area of the storage layer. Thus, when a current flows in the storage layer in the element 25 via the selector members 22, the current flowing in the storage layer is integrated into the part where the storage layer is coupled to each selector member 22. For this reason, it is possible to expect a current constriction effect (an effect in which an initial action of magnetization reversal in a storage layer is stimulated), and it is further possible to expect reduction of a write current. Even in a case where other elements involved in a coupling of the element 24 with the storage layer of the element 25, it is desirable to form a mutually-independent conductive path between such elements and each of the selector members 22 in the element 24. The above-described relationship between the element 24 and the element 25 is the same as the relationship between the element 29 and the element 30. The details of the configuration of the magnetoresistive effect elements MTJ will be described later.

1.1.3 Configuration of Magnetoresistive Effect Element

Figure 5:
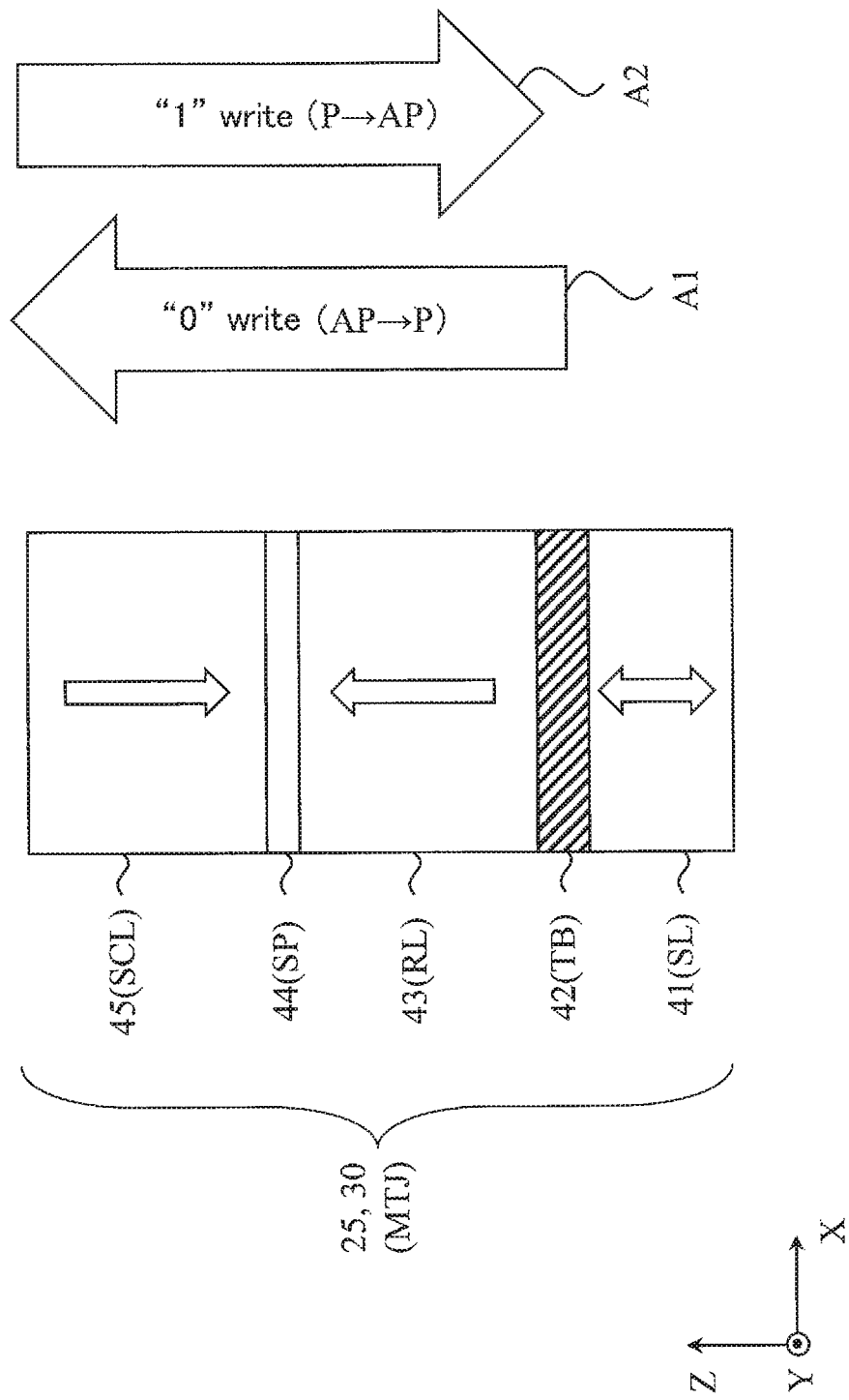
FIG. 5 is a cross-sectional view illustrating a configuration of a magnetoresistive effect element of the magnetic storage device according to the first embodiment.

Next, a configuration of the magnetoresistive effect element of the magnetic storage device according to the first embodiment will be described with reference to FIG. 5. FIG. 5 is a cross-sectional view illustrating a configuration of the magnetoresistive effect element of the magnetic storage device according to the first embodiment. FIG. 5 shows an example of a cross section of the magnetoresistive effect element MTJ shown in FIG. 5 (i.e., the element 25 or the element 30), taken along a plane perpendicular in the Z direction (e.g., the XZ plane).

As shown in FIG. 5, each of the elements 25 and 30 includes a ferromagnetic material 41 functioning as a storage layer SL, a non-ferromagnetic material 42 functioning as a tunnel barrier layer TB, a ferromagnetic material 43 functioning as a reference layer RL, a non-ferromagnetic material 44 functioning as a spacer layer SP, and a ferromagnetic material 45 functioning as a shift canceling layer SCL.

In the element 25, a plurality of materials, for example, the ferromagnetic material 41, the non-ferromagnetic material 42, the ferromagnetic material 43, the non-ferromagnetic material 44, and the ferromagnetic material 45 are stacked in this order, from the word line WLd side toward the bit line BL side (in the direction of the Z axis). In the element 30, a plurality of materials, for example, the ferromagnetic material 41, the non-ferromagnetic material 42, the ferromagnetic material 43, the non-ferromagnetic material 44, and the ferromagnetic material 45 are stacked in this order, from the bit line BL side toward the word line WLu side (in the direction of the Z axis). The elements 25 and 30 function as, for example, perpendicular magnetization type MTJ elements in which each of the magnetization directions of the magnetic materials that constitute the elements 25 and 30 is oriented in a perpendicular direction with respect to a film surface.

The ferromagnetic material 41 has ferromagnetic properties, and has an axis of easy magnetization in a direction perpendicular to a film surface. The ferromagnetic layer 41 has a magnetization direction toward either the bit line BL side or the word line WL side. The ferromagnetic material 41 includes, for example, cobalt-iron-boron (CoFeB) or iron boride (FeB), and may have a crystalline structure of a body-centered cubic (bcc) type.

The non-ferromagnetic material 42 is a non-ferromagnetic insulating film, and includes magnesium oxide (MgO), for example. The non-ferromagnetic material 42 is arranged between the ferromagnetic material 41 and the ferromagnetic material 43, and constitutes a magnetic tunnel junction therebetween.

The ferromagnetic material 43 has ferromagnetic properties, and has an axis of easy magnetization in a direction perpendicular to a film surface. The ferromagnetic layer 43 has a magnetization direction toward either the bit line BL side or the word line WL side. The ferromagnetic material 43 includes, for example, cobalt-iron-boron (CoFeB) or iron boron (FeB). The magnetization direction of the ferromagnetic material 43 is fixed, and in the example of FIG. 5, the magnetization direction is oriented to the ferromagnetic material 45. In this description, "a magnetization direction is fixed" means that the magnetization direction is not changed by an electric current (spin torque) of such a magnitude that the magnetization direction of the ferromagnetic material 41 can be reversed.

Although the illustration is omitted in FIG. 5, the ferromagnetic material 43 may be a multi-layered body consisting of multiple films. Specifically, for example, the multi-layered body that constitutes the ferromagnetic material 43 may have a structure in which an additional ferromagnetic material is stacked on the surface of the ferromagnetic material 45 layer side in the above-described layers, with a non-magnetic conductor being interposed therebetween. The non-magnetic conductor in the multi-layered body constituting the ferromagnetic material 43 may include at least one metal selected from, for example, tantalum (Ta), hafnium (Hf), tungsten (W), zirconium (Zr), molybdenum (Mo), niobium (Nb), and titanium (Ti). The additional ferromagnetic material in the multi-layered body constituting the ferromagnetic material 43 may include at least one artificial lattice selected from, for example, a multi-layered film made of cobalt (Co) and platinum (Pt) (i.e., Co/Pt multi-layered film), a multi-layered film made of Co and nickel (Ni) (i.e., Co/Ni multi-layered film), and a multi-layered film made of Co and palladium (Pd) (i.e., Co/Pd multi-layered film).

The non-ferromagnetic material 44 is a non-magnetic conductive film, and includes at least one element selected from, for example, ruthenium (Ru), osmium (Os), iridium (Ir), vanadium (V), and chromium (Cr).

The ferromagnetic material 45 has ferromagnetic properties, and has an axis of easy magnetization in a direction perpendicular to a film surface. The ferromagnetic layer 45 includes at least one alloy selected from, for example, cobalt platinum (CoPt), cobalt nickel (CoNi), and cobalt palladium (CoPd). The ferromagnetic material 45 may be a multi-layered body consisting of multiple layers, similarly to the ferromagnetic material 43. In this case, the ferromagnetic material 45 may include at least one artificial lattice selected from, for example, a multi-layered film made of cobalt (Co) and platinum (Pt) (i.e., Co/Pt multi-layered film), a multi-layered film made of cobalt (Co) and nickel (Ni) (i.e., Co/Ni multi-layered film), and a multi-layered film made of cobalt (Co) and palladium (Pd) (i.e., Co/Pd multi-layered film).

The ferromagnetic layer 45 has a magnetization direction oriented toward the bit line BL side or the word line WL side. The magnetization direction of the ferromagnetic material 45 is fixed, and in the example of FIG. 5, the magnetization direction is oriented to the ferromagnetic material 43. In this description, "a magnetization direction is fixed" means that the magnetization direction is not changed by an electric current (spin torque) of such a magnitude that the magnetization direction of the ferromagnetic material 41 can be reversed.

The ferromagnetic materials 43 and 45 are coupled in an anti-ferromagnetic manner by the non-ferromagnetic material 44. In other words, the ferromagnetic materials 43 and 45 are coupled in a manner in which they have mutually-antiparallel magnetization directions. In the example illustrated in FIG. 5, the magnetization direction of the ferromagnetic material 43 is oriented to the ferromagnetic material 45 for this reason. Such a bonding structure of the above-described ferromagnetic material 43, non-ferromagnetic material 44, and ferromagnetic material 45 is called a synthetic anti-ferromagnetic (SAF) structure. It is thereby possible for the ferromagnetic material 45 to cancel influence of the stray field of the ferromagnetic material 43 upon the magnetization direction of the ferromagnetic material 41. For this reason, it is possible to suppress an occurrence of asymmetry in the susceptibility to magnetization reversal of the ferromagnetic material 41 (in other words, difference in the susceptibility to reversal of a magnetization direction between the reversal in a certain direction and the reversal in its opposite direction) caused by external factors due to stray field, etc., of the ferromagnetic material 43.

In the first embodiment, a spin injection write scheme is adopted, and the scheme includes supplying a write current directly to such a magnetoresistive effect element MTJ, injecting spin torque into the storage layer SL and the reference layer RL by this write current, and controlling the magnetization direction of the storage layer SL and the magnetization direction of the reference layer RL. The magnetoresistive element MTJ can take one of a low-resistance state and a high-resistance state, depending on whether the relative relationships of the magnetization directions of the storage layer SL and the reference layer RL are parallel or antiparallel.

If a write current Iw0 of a certain amplitude is supplied to the magnetoresistive effect element MTJ in the direction indicated by arrow A1 in FIG. 5, i.e., from the storage layer SL to the reference layer RL, the relative relationships between the magnetization directions of the storage layer SL and the reference layer RL becomes parallel. In this parallel state, the resistance value of the magnetoresistive element MTJ becomes smallest, and the magnetoresistive element MTJ is set to a low-resistance state. This low-resistance state is called a "P (parallel) state", and defined as a data "0" state.

If a write current Iw1 larger than the write current Iw0 is supplied to the magnetoresistive element MTJ in the direction indicated by arrow A2 in FIG. 5, i.e., from the reference layer RL to the storage layer SL (the direction opposite to arrow A1), the relative relationships between the magnetization directions of the storage layer SL and the reference layer RL becomes antiparallel. In this antiparallel state, the resistance value of the magnetoresistive element MTJ becomes greatest, and the magnetoresistive element MTJ is set to a high-resistance state. This high-resistance state is called an "AP (anti-parallel) state", and is defined as a data "1" state.

The following description will be given pursuant to the above-described data-defining method; however, how data "1" and data "0" are defined is not limited to the above-described example. For example, the P state may be defined as data "1", and the AP state may be defined as data "0".

1.2 Manufacturing Method

Next, a manufacturing method of the memory cell array of the magnetic storage device according to the first embodiment will be described.

Figure 6:
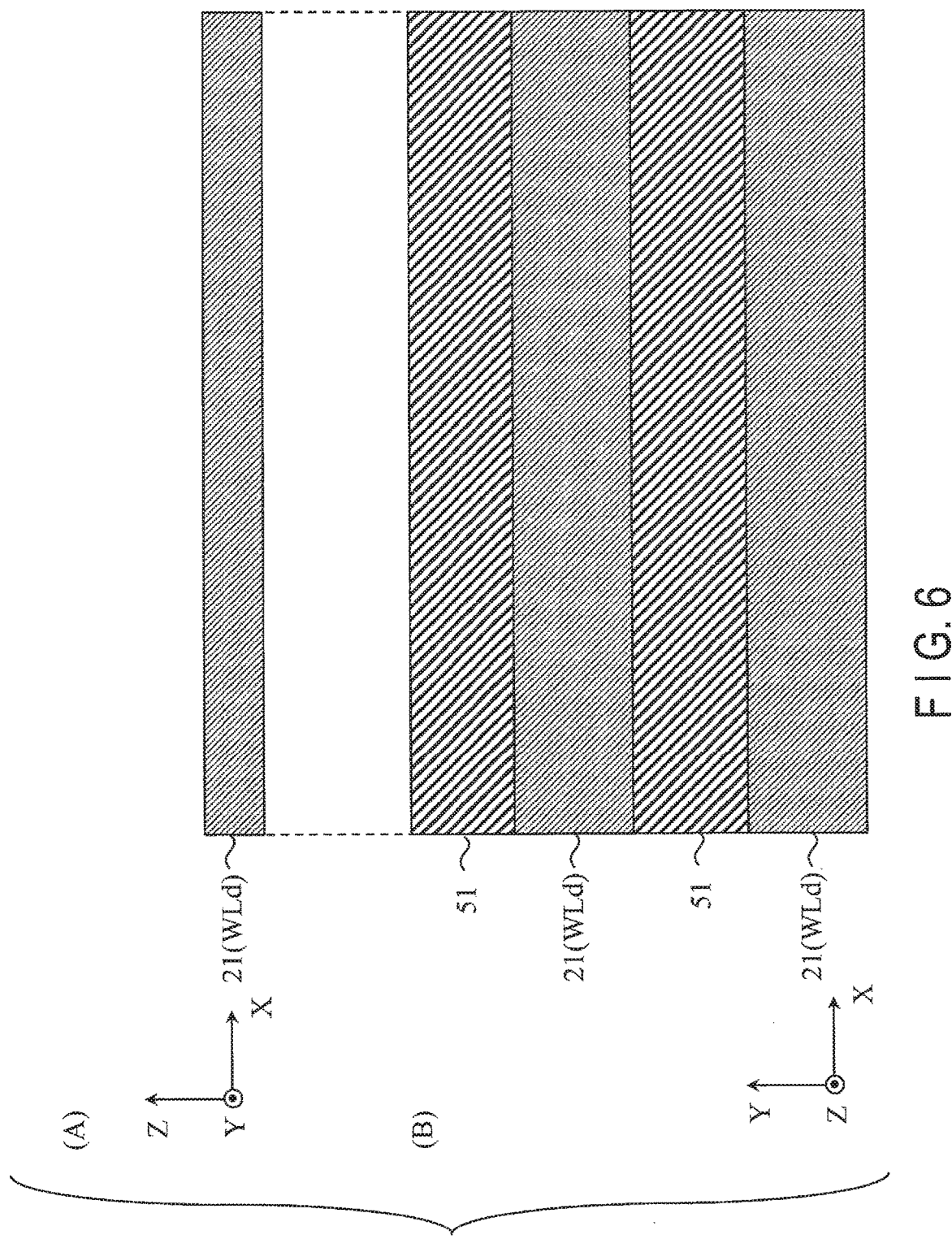
FIG. 6 is a schematic view illustrating a method of manufacturing the memory cell array of the magnetic storage device according to the first embodiment.

FIGS. 6 to 9 are schematic views illustrating a method of manufacturing the memory cell array of the magnetic storage device according to the first embodiment. In FIGS. 6 to 9, for convenience of description, how the layers are stacked of the materials from which the word lines WLd, the selectors SELd, and the magnetoresistive effect elements MTJd are made is illustrated, and the illustration of the other layers constituting the memory cell array 10 is omitted. FIGS. 6, 7, 8, and 9 include FIGS. 6 (A) and 6 (B), FIGS. 7 (A) and 7 (B), FIGS. 8 (A) and 8 (B), and FIGS. 9 (A) and 9 (B), respectively. More specifically, FIGS. 6 (A), 7 (A), 8 (A), and 9 (A) show the cross section of the materials from which the word lines WLd, the selectors SELd, and the magnetoresistive effect elements MTJd are respectively made, taken in the Y direction. FIGS. 6 (B), 7 (B), 8 (B), and 9 (B) show the plan views of the materials from which the word lines WLd, the selectors SELd, and the magnetoresistive effect elements MTJd are respectively made, taken in the Z direction.

As shown in FIG. 6, a plurality of conductors 21 that function as the word lines WLd are provided on or above a not-shown semiconductor substrate. The plurality of conductors 21 are arranged in the Y direction, each extending in the X direction. An insulator 51 is arranged between the conductors 21 arranged alongside each other in the Y direction.

Figure 7:
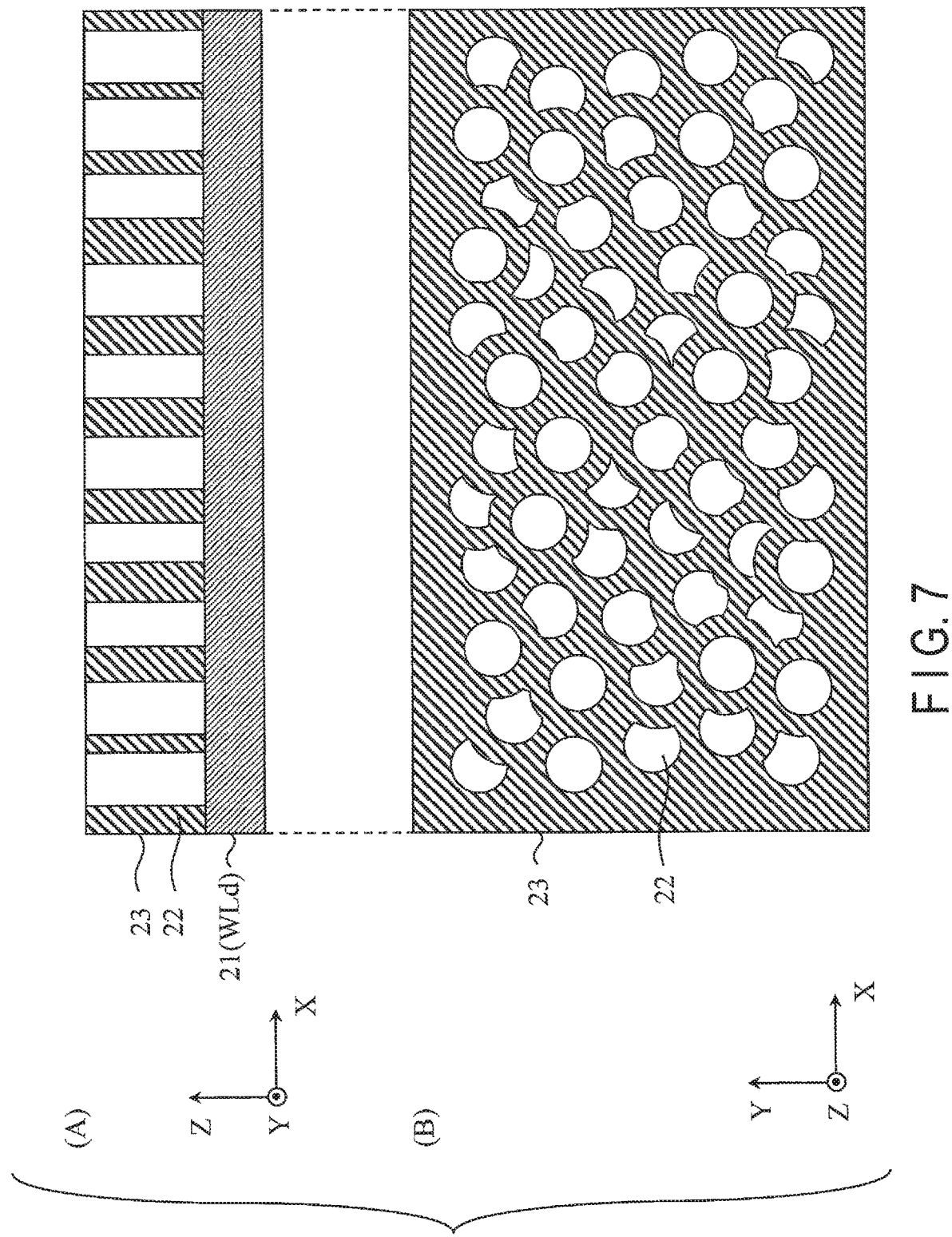
FIG. 7 is a schematic view illustrating a method of manufacturing the memory cell array of the magnetic storage device according to the first embodiment.

Subsequently, as shown in FIG. 7, a plurality of selector members 22 and an insulator 23 are arranged on the upper surfaces of the conductors 21 and of the insulator 51, across the XY plane. The selector members 22 and the insulator 23 are formed on the conductors 21 and the insulator 51 by sputtering, for example, the elements included in the selector members 22 and the insulator 23 simultaneously. By setting the conditions of sputtering as appropriate, the elements included in the selector members 22 form a plurality of islands on the upper surfaces of the conductors 21 and of the insulators 51. The plurality of islands are randomly formed on the upper surfaces of the conductors 21 and of the insulator 51. Furthermore, the insulator 23 is formed on the side surfaces of the islands.

The islands formed from the elements included in the selector members 22 thereby grow into pillar shapes along the Z direction, without touching each other. At least some of the elements constituting the selector members 22 are oxidized or nitridized by introducing an oxygen gas or a nitrogen gas when forming the selector members 22. In this case, by adjusting the conditions of the forming, it is possible to obtain a structure that separates the selector members 22 by an oxide or a nitride. For this reason, the islands formed from the elements included in the selector members 22 can have, if they grow to a predetermined height, a function as a switch between two terminals. The method of forming the selector members 22 and the insulator 23 is not limited to a sputtering method; for example, a vapor deposition method, etc., can be adopted.

Subsequently, as shown in FIG. 8, a memory member 52 is provided on the upper surfaces of the selector members 22 and of the insulator 23, across the XY plane. The memory member 52 has a multi-layered structure consisting of various materials that function as the magnetoresistive effect elements MTJ as described with reference to FIG. 5.

Subsequently, as shown in FIG. 9, the memory member 52 is removed except for the regions where the elements 25 are to be formed. Specifically, for example, a not-shown mask is provided on the memory member 52. Subsequently, after forming a pattern corresponding to the regions where the elements 25 are to be formed is formed by lithography, the memory member 52 is etched (by an ion beam etching (IBE) method, for example) based on the obtained pattern. A plurality of elements 25 are thus formed. The elements 25 are formed, for example, in line along the X direction above the conductors 21 that extend in the X direction. Subsequently, each of the elements 25 can have a function as a magnetoresistive effect element MTJ as a result of an annealing processing in which the elements are subjected to externally-provided heat (for example, a heat in the range of 300° C. to 400° C.). Each element 25 is formed so as to have a cross-sectional area larger than that of each selector member 22. The selector members 22 are formed in such a manner that the distribution thereof is more densely than that of the elements 25. For this reason, a part of or the entire upper surface of at least one selector member 22 is arranged to be in contact with the lower surface of the element 25. Accordingly, of the selector members 22, at least one or more of the selector members 22 coupled to the element 25 can function as one selector SELd.

Subsequently, the conductors 26 are provided on the upper surfaces of the elements 25 arranged along the Y direction, and one stage of a structure in which memory cells MC are disposed between a word line WL and a bit line BL in Z direction is thereby formed. Hereinafter, multiple stages of the structure can be formed by performing the same steps as those of the above-described manufacturing method. When forming multiple stages of the structure, the annealing processing may be performed in a batch after all the stages are formed.

This is the end of the manufacturing of the memory cell array 10.

1.3 Effects according to First Embodiment

According to the first embodiment, the semiconductor storage device 1 has a memory cell array 10 having the structure in which memory cells MC are disposed between a word line WL and a bit line BL in Z direction. Each of the memory cells MC includes the elements 25 functioning as magnetoresistive effect elements MTJ and the elements 24 functioning as selectors SEL coupled in series. The selector members 22 and the insulator 23 are formed by sputtering the elements included in the selector members 22 and the insulator 23 and by introducing an oxygen gas and a nitrogen gas. The plurality of selector members 22 are thereby randomly arranged across the XY plane, and are thereby formed into pillar shapes along the Z direction. The side surface of each selector member 22 is covered by the insulator 23. A leak of a current via the insulator 23 is thereby suppressed, while each selector member 22 is able to maintain the function as a switch between two terminals. In other words, if at least one selector member 22 is coupled to the element 25, this set of the selector member 22 and the element 25 being coupled to each other can function as a memory cell MC. Each selector member 22 is formed so as to have a cross-sectional area smaller than that of the element 25. It is thereby possible to avoid one selector member 22 from being coupled to more than one element 25 in common. On the other hand, the selector members 22 are more densely arranged in the XY plane than the elements 25. A structure in which one or more selector members 22 are electrically coupled to one element 25 via mutually-different paths, and a selector member 22e that is not physically coupled to any of the elements 25 included in two neighboring memory cells MC, is thereby formed.

According to the above-described manufacturing method, it is possible to separately form the selectors SEL for each memory cell MC without etching, and also possible to reduce a load in the process of manufacturing the memory cells MC. As supplemental information, as a method of forming magnetoresistive effect elements MTJ and selectors SEL, a method for separating materials stacked on the XY plane into elements by an ion beam etching technique is known. Since an ion beam is irradiated at a predetermined entrance angle, a depth for which the etching can be performed is restricted in accordance with a pitch between the memory cells MC. In other words, according to the element separation method using an ion beam for forming the memory cells MC, a film thickness of the magnetoresistive effect elements MTJ and of the selectors SEL may be restricted. According to the first embodiment, the selectors SEL are separated for each memory cell MC, without being etched together with the magnetoresistive effect elements MTJ. It is thereby possible to mitigate the restriction on the thickness of the magnetoresistive effect elements MTJ and of the selectors SEL due to the upper limit of the etching depth, compared to the case where etching is performed for the magnetoresistive effect elements MTJ and the selectors SEL simultaneously. It is therefore possible to reduce the load when working on the memory cells MC.

If the plurality of selector members 22 are electrically coupled to the ferromagnetic material 41 in mutually-different constricted paths (especially the case where the selector members 22 are independently in contact with the ferromagnetic material 41), the density of a current flowing into the ferromagnetic material 41 increases. It is therefore possible to reduce an amount of a write current required for reversing the magnetization direction of the ferromagnetic material 41.

1.4 Modifications of First Embodiment

The first embodiment is not limited to the above-mentioned example, and can be modified in various ways. For example, a plurality of selector members 22 are formed in pillar shapes on the upper surfaces of the conductors 21 and of the insulator 51 in the above-described first embodiment; however, the first embodiment is not limited to this example. For example, the selector members 22 may be formed on the upper surface of a material that serves as a nucleus (seed), so as to phase-separate and easily grow in the insulator 23. In the following, the descriptions of the configurations and manufacturing method similar to those in the first embodiment will be omitted, and mainly configurations and a manufacturing method different from those in the first embodiment will be described.

Figure 10:
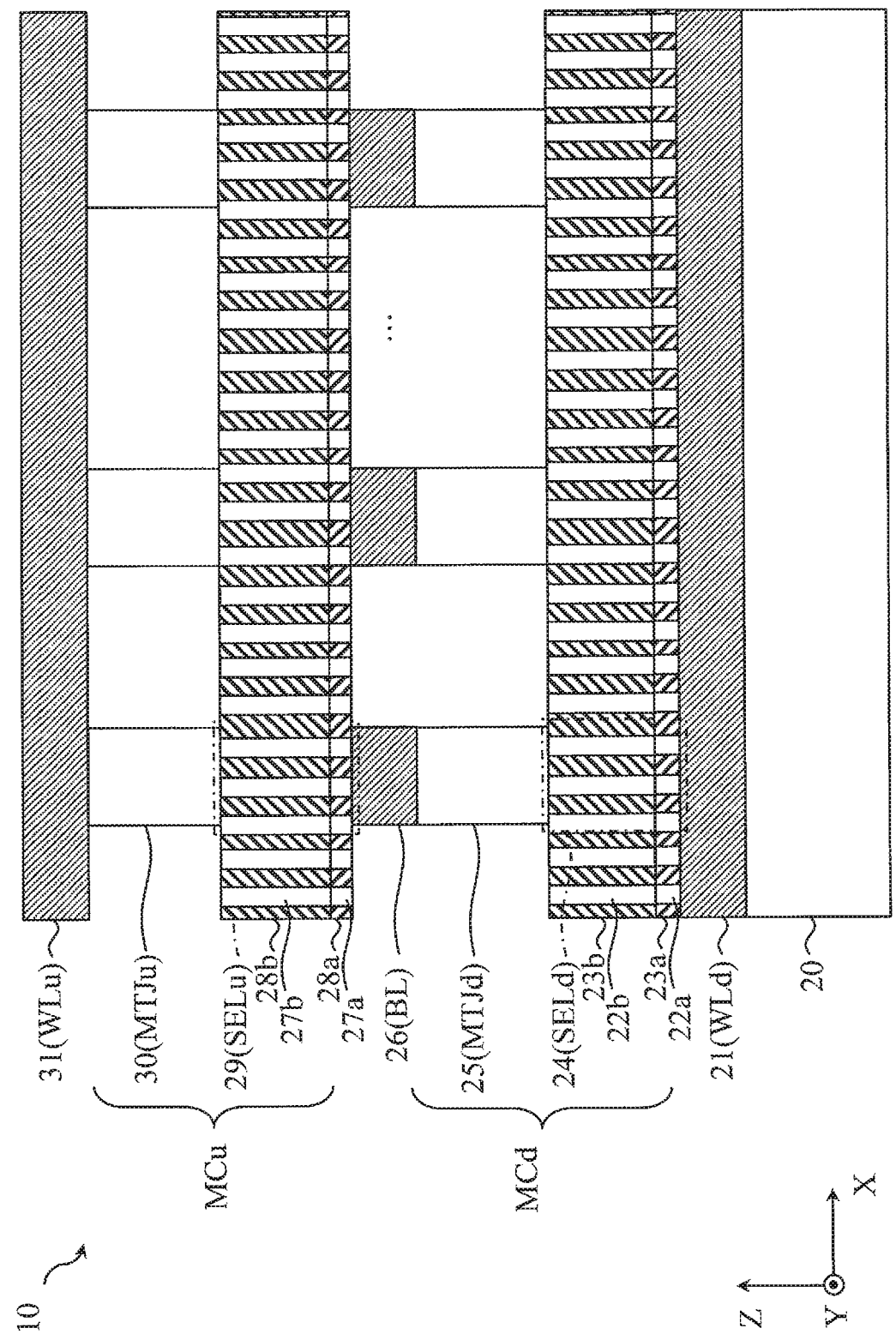
FIG. 10 is a cross-sectional view illustrating a configuration of a memory cell array of a magnetic storage device according to a modification of the first embodiment.

FIG. 10 is a cross-sectional view illustrating a configuration of a memory cell array of a magnetic storage device according to a modification of the first embodiment. FIG. 10 corresponds to FIG. 3 illustrating the first embodiment.

As shown in FIG. 10, a plurality of seed members 22a are formed on the upper surfaces of the conductors 21 and of a not-shown insulator, across the XY plane. The seed members 22a include, for example, metal elements, etc., included in the selector members 22b. An insulator 23a is formed on the side surface of each seed member 22a. The insulator 23a includes, for example, silicon dioxide ($SiO_2$).

A plurality of selector members 22b are formed on the plurality of seed members 22a, across the XY plane. Each of the selector members 22b is formed in a pillar shape along the Z direction, and an insulator 23b is formed on the side surface of each selector member.

The memory cells MCu also have a structure equivalent to the memory cells MCd. Specifically, a plurality of selector members 27a are formed on the upper surfaces of the plurality of conductors 26 and of the not-shown insulator, across the XY plane. The seed members 27a include, for example, metal elements, etc., included in the selector members 27b. An insulator 28a is formed on the side surface of each seed member 27a. The insulator 28a includes, for example, silicon dioxide ($SiO_2$).

A plurality of selector members 27b are formed on the plurality of seed members 27a, across the XY plane. Each of the selector members 27b is formed in a pillar shape along the Z direction, and an insulator 28b is formed on the side surface of each selector member 27b.

Each of the seed members 22a and 27a has a function as a nucleus (seed) that stimulates the formation of the selector members 22b and 27b. In other words, the seed members 22a make the selector members 22b more easily phase-separatable from the insulators 23b, compared to the case where the selector members 22b are formed on the conductors 21. Similarly, the seed members 27a make the selector members 27b more easily phase-separatable from the insulator 28b, compared to the case where the selector members 27b are formed on the conductors 26. Furthermore, the seed members 22a and 27a may have a function of controlling the orientation of the crystalline structure of the selector members 22b and 27b when the selector members 22b and 27b are formed. It is thereby possible to obtain selectors SELd and SELu with better quality compared to the case where the seed members 22a and 27a are not used.

Figure 11:
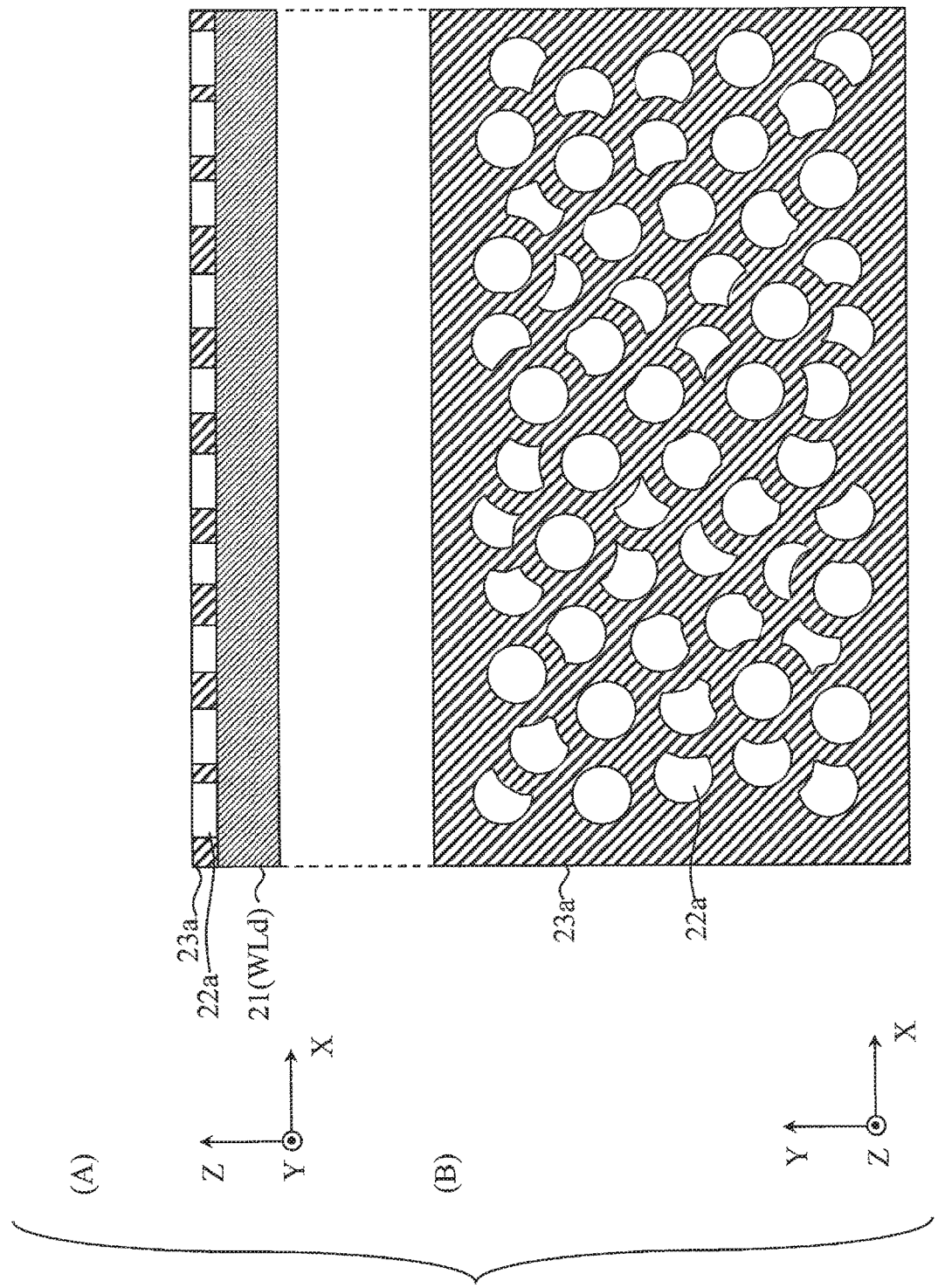
FIG. 11 is a schematic view illustrating a method of manufacturing the memory cell array of the magnetic storage device according to the modification of the first embodiment.

FIGS. 11 to 12 are schematic views illustrating a method of manufacturing the magnetic storage device according to the modification of the first embodiment. In FIGS. 11 and 12, for convenience of description, how the layers are stacked of the materials from which the word lines WLd, the selectors SELd, and the magnetoresistive effect elements MTJd are made is illustrated, and the illustration of the other layers constituting the memory cell array 10 is omitted. FIGS. 11 and 12 include FIGS. 11 (A) and 11 (B) and FIGS. 12 (A) and 12 (B), respectively. More specifically, FIGS. 11 (A) and 12 (A) show the cross section of the materials from which the word lines WLd, the selectors SELd, and the magnetoresistive effect elements MTJd are respectively made, taken in the Y direction. FIGS. 11 (B), and 12 (B) show the cross section of the materials from which the word lines WLd, the selectors SELd, and the magnetoresistive effect elements MTJd are respectively made, taken in the Z direction.

Subsequently, as shown in FIG. 11, the plurality of seed members 22a and the insulator 23a are arranged on the upper surfaces of the conductors 21 and of the insulator 51, across the XY plane. The seed members 22a and the insulator 23a are formed on the conductors 21 and the insulator 51 by sputtering, for example, the seed members 22a and the insulator 23a simultaneously. By setting the conditions of sputtering as appropriate, the elements included in the seed members 22a form a plurality of islands on the upper surfaces of the conductors 21 and of the insulator 51. The plurality of islands are randomly formed on the upper surfaces of the conductors 21 and of the insulator 51. Furthermore, the insulator 23a is formed on the side surfaces of the islands.

Subsequently, as shown in FIG. 12, a plurality of seed members 22b and an insulator 23b are arranged on the upper surfaces of the seed members 22a and of the insulator 23a, across the XY plane. The selector members 22b and the insulator 23b are formed on the seed members 22a and the insulator 23a by sputtering, for example, the selector members 22b and the insulator 23b simultaneously. As described above, for the seed members 22a, a material which allows the selector members 22b to be phase-separated from the insulator 23b and easily formed and/or a material that allows control of the orientation of the selector members 22b are selected. For this reason, the selector members 22b are selectively formed on the seed members 22a.

As described above, with the seed members 22a, it is possible to form more easily a plurality of phase-separated selector members 22b in the insulator 23b. For example, even if a material that tends to be relatively easily mixed with the insulator 23b is selected as a material for the selector members 22b, it is possible to selectively form the selector members 22b on the seed members 22a. Therefore, it is possible to suppress degradation of the function as the selectors SEL.

2. Second Embodiment

The selector members 22 are formed by sputtering in the first embodiment; however, the selector members 22 may be formed in various ways. For example, the selector members 22 may be formed by lithography by using a pattern formed by a mask including a material capable of self-assembling. In the following, the descriptions of the configurations and manufacturing method similar to those in the first embodiment will be omitted, and mainly configurations and a manufacturing method different from those in the first embodiment will be described.

2.1 Configuration of Memory Cell Array

First, a configuration of the memory cell array of the magnetic storage device according to the second embodiment will be described.

Figure 13:
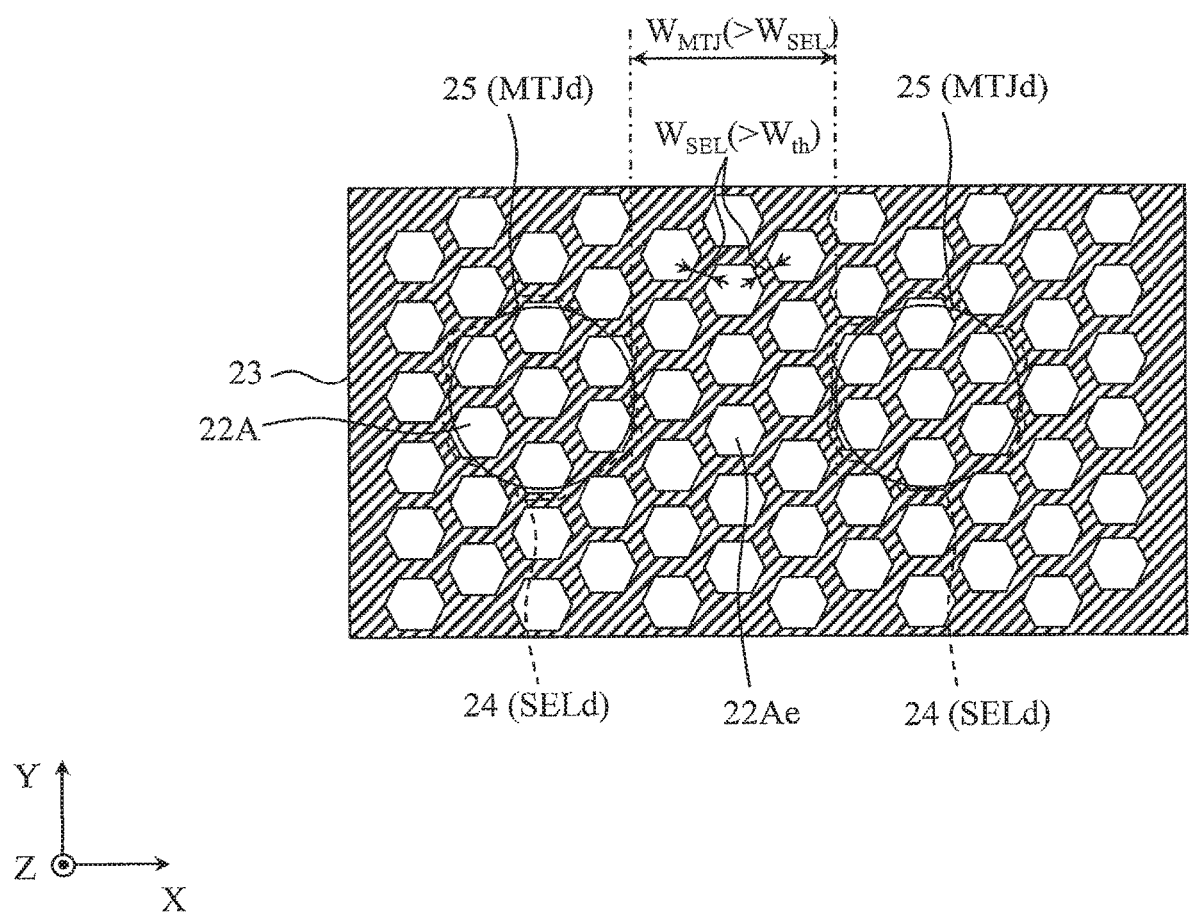
FIG. 13 is a plan view illustrating a configuration of a memory cell array of a magnetic storage device according to a second embodiment.

FIG. 13 is a plan view illustrating a configuration of the memory cell array of the magnetic storage device according to the second embodiment. FIG. 13 corresponds to FIG. 4 described in the first embodiment, and in FIG. 13, selector members 22A are provided instead of the selector members 22 in FIG. 4.

As shown in FIG. 13, each of the selector members 22A are electrically disconnected from each other by the insulator 23 being interposed therebetween, across the XY plane. The selector members 22A are formed so that the width $W_{SEL}$ between of the selector members 22A is greater than at least a threshold $W_{th}$ and smaller than a width $W_{MTJ}$ of two neighboring elements 25. The cross section of each selector member 22A along the coupling surface is not limited to a circular shape, and may be any random shape (a hexagonal shape in the example illustrated in FIG. 13). If a pattern is formed by self-assembling, the selectors 22A may be arranged with regularity across the XY plane. FIG. 13 shows an example where the selectors 22A are formed in a periodic structure of hexagonal arrangement, but the present embodiment is not limited to this example; a pattern selected as appropriate (including the random pattern in the first embodiment as illustrated in FIG. 4) may be adopted.

The cross-sectional area of each selector member 22A is smaller than the cross-sectional area of the element 25. For this reason, the upper surfaces of the selector members 22A are coupled in common to the lower surface of one element 25. Furthermore, as described above, since the width $W_{SEL}$ is smaller than the width $W_{MTJ}$, one or more selector members 22Ae not being coupled to any of the elements 25 in two neighboring memory cells MC may be arranged between the two neighboring memory cells MC. The side surfaces of the selector members 22Ae are covered with the insulator 23, similarly to the selector members 22A constituting the element 24. In the selector members 22Ae, at least one of the upper surfaces or the lower surfaces are covered with an insulator (not shown). Two elements 24 included in two neighboring memory cells MC are electrically disconnected by the insulator 23, regardless of the presence/absence of the selector members 22Ae. For this reason, it is possible to suppress a leak of a current flowing in one of two neighboring memory cells MC to the other memory cell MC when the current flows in the direction along the XY plane in the layer where the selector members 22A are formed.

2.2 Manufacturing Method

Next, a manufacturing method of the memory cell array of the magnetic storage device according to the second embodiment will be described.

Figure 14:
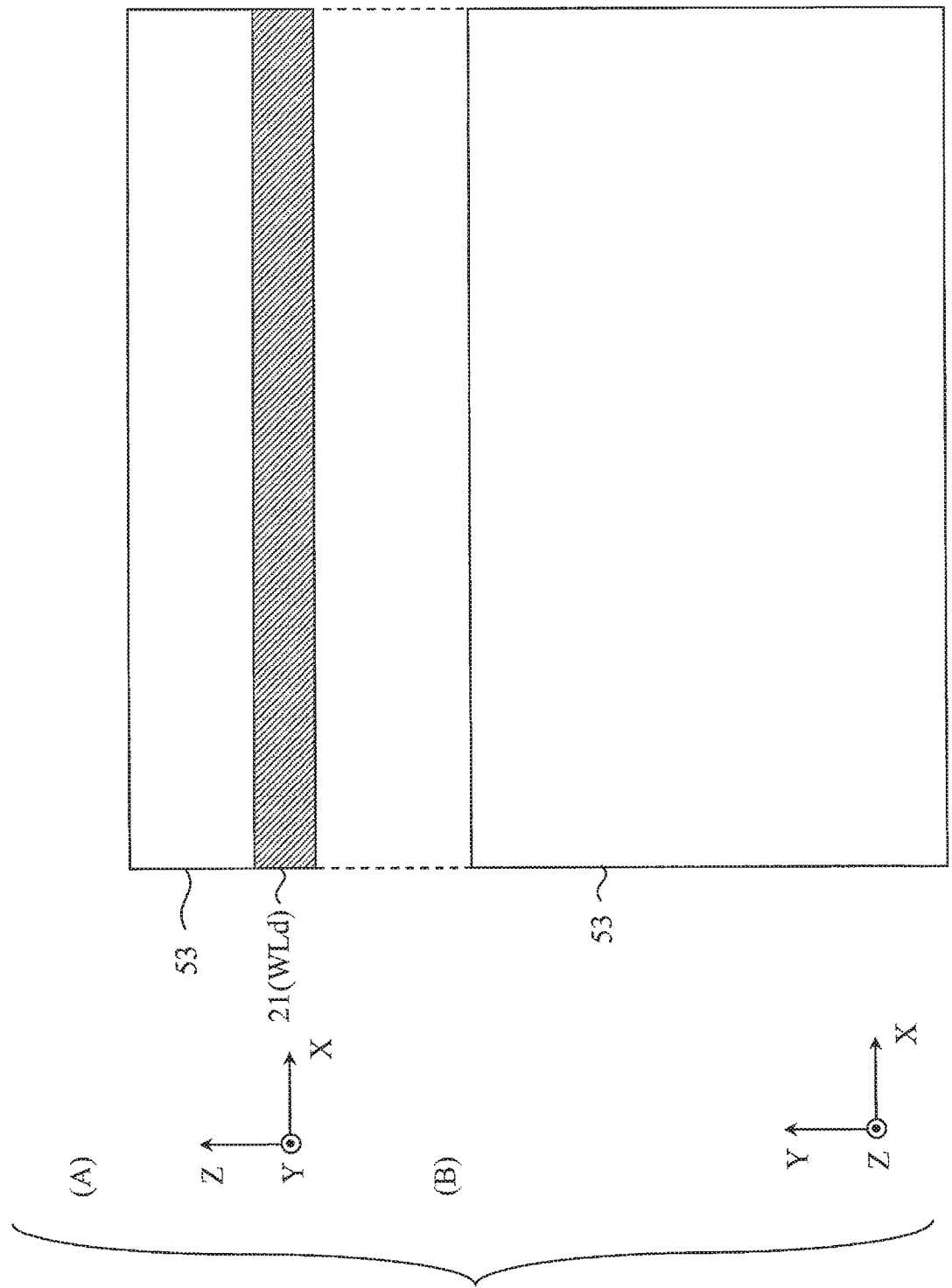
FIG. 14 is a schematic view illustrating a method of manufacturing the memory cell array of the magnetic storage device according to the second embodiment.

FIGS. 14 to 18 are cross-sectional views illustrating the configuration of the memory cell array of the magnetic storage device according to the second embodiment. In FIGS. 14 to 18, for convenience of description, how the layers are stacked of the materials, from which the word lines WLd, the selectors SELd, and the magnetoresistive effect elements MTJd are made is illustrated, and the illustration of the other layers constituting the memory cell array 10 is omitted. FIGS. 14, 15, 16, 17, and 18 include FIGS. 14 (A) and 14 (B), FIGS. 15 (A) and 15 (B), FIGS. 16 (A) and 16 (B), FIGS. 17 (A) and 17 (B), and FIGS. 18 (A) and 18 (B), respectively. More specifically, FIGS. 14 (A), 15 (A), 16 (A), 17 (A), and 18 (A) show the cross section of the materials from which the word lines WLd, the selectors SELd, and the magnetoresistive effect elements MTJd are respectively made, taken in the Y direction. FIGS. 14 (B), 15 (B), 16 (B), 17 (B), and 18 (B) show the cross section of the materials from which the word lines WLd, the selectors SELd, and the magnetoresistive effect elements MTJd are respectively made, taken in the Z direction.

As shown in FIG. 14, a selector member 53 is provided on the upper surfaces of the selector members 21 and of the insulator 51, across the XY plane. The selector member 53 includes a material equivalent to the material of the selector members 22A. The selector member 53 is formed by, for example, chemical vapor deposition (CVD), etc.

Figure 15:
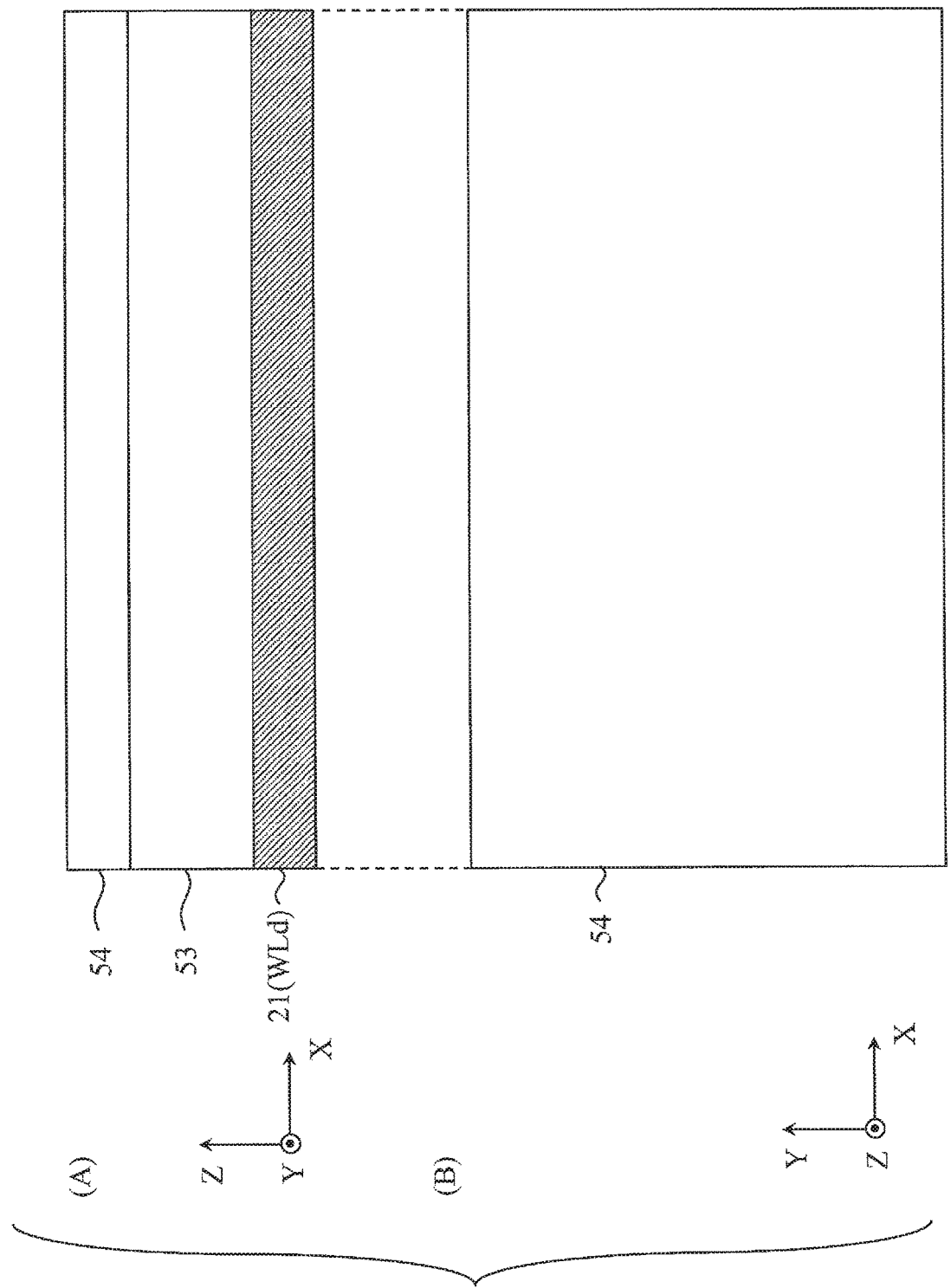
FIG. 15 is a schematic view illustrating a method of manufacturing the memory cell array of the magnetic storage device according to the second embodiment.

Subsequently, as shown in FIG. 15, a photo mask 54 is provided on the upper surface of the selector member 53. The photo mask 54 includes a material capable of self-assembling. Specifically, the photo mask 54 may include, for example, di-block copolymers but not limited thereto; however, any material can be adopted as long as the material is a mixture of two materials capable of self-assembling.

Figure 16:
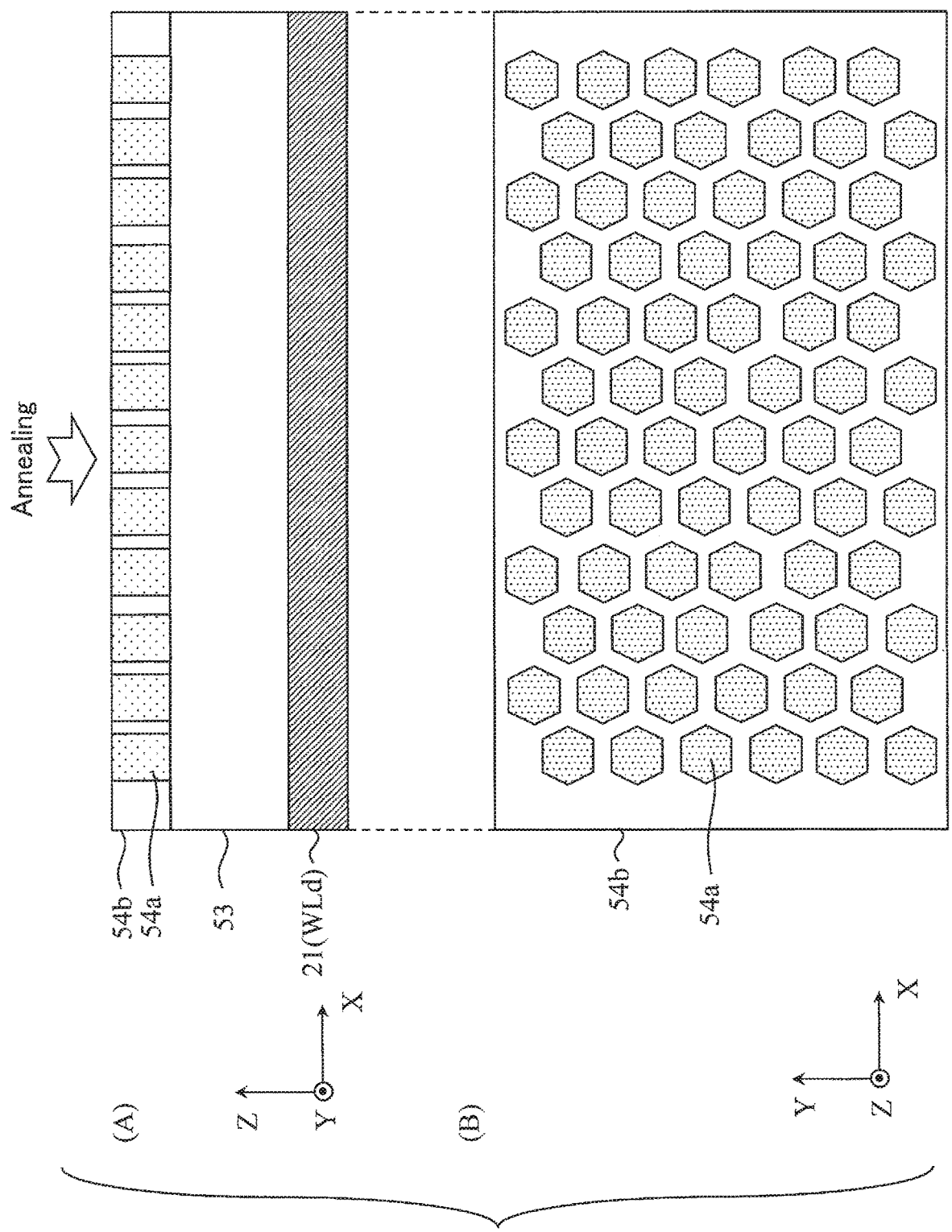
FIG. 16 is a schematic view illustrating a method of manufacturing the memory cell array of the magnetic storage device according to the second embodiment.

Subsequently, as shown in FIG. 16, self-assembling is induced by performing an annealing processing in which a heat is applied to the photo mask 54. In the photo mask 54, a periodic structure is formed when the same materials included in the photo mask 54 are assembled by thermal energy given by the annealing processing. In the example of FIG. 16, of the two materials 54a and 54b included in the photo mask 54, the material 54a forms, by self-assembling, a periodic structure of hexagonal arrangement along the XY plane. In FIG. 16, the materials 54a are shown by dot-shading. The materials 54a formed by self-assembling are formed into, for example, pillar shapes along the Z direction, and their side surfaces are covered by the material 54b. Thus, a plurality of materials 54a are phase-separated from the material 54b and form a pattern to be transferred to the selector member 53. A method of inducing self-assembling is not limited to annealing processing, and any appropriate method can be adopted.

Subsequently, as shown in FIG. 17, after the material 54b is selectively removed with respect to the materials 54a, etching is performed to the selector member 53 in accordance with the pattern formed from the materials 54a. Thus, a plurality of selector members 22A are formed in accordance with the pattern.

Figure 18:
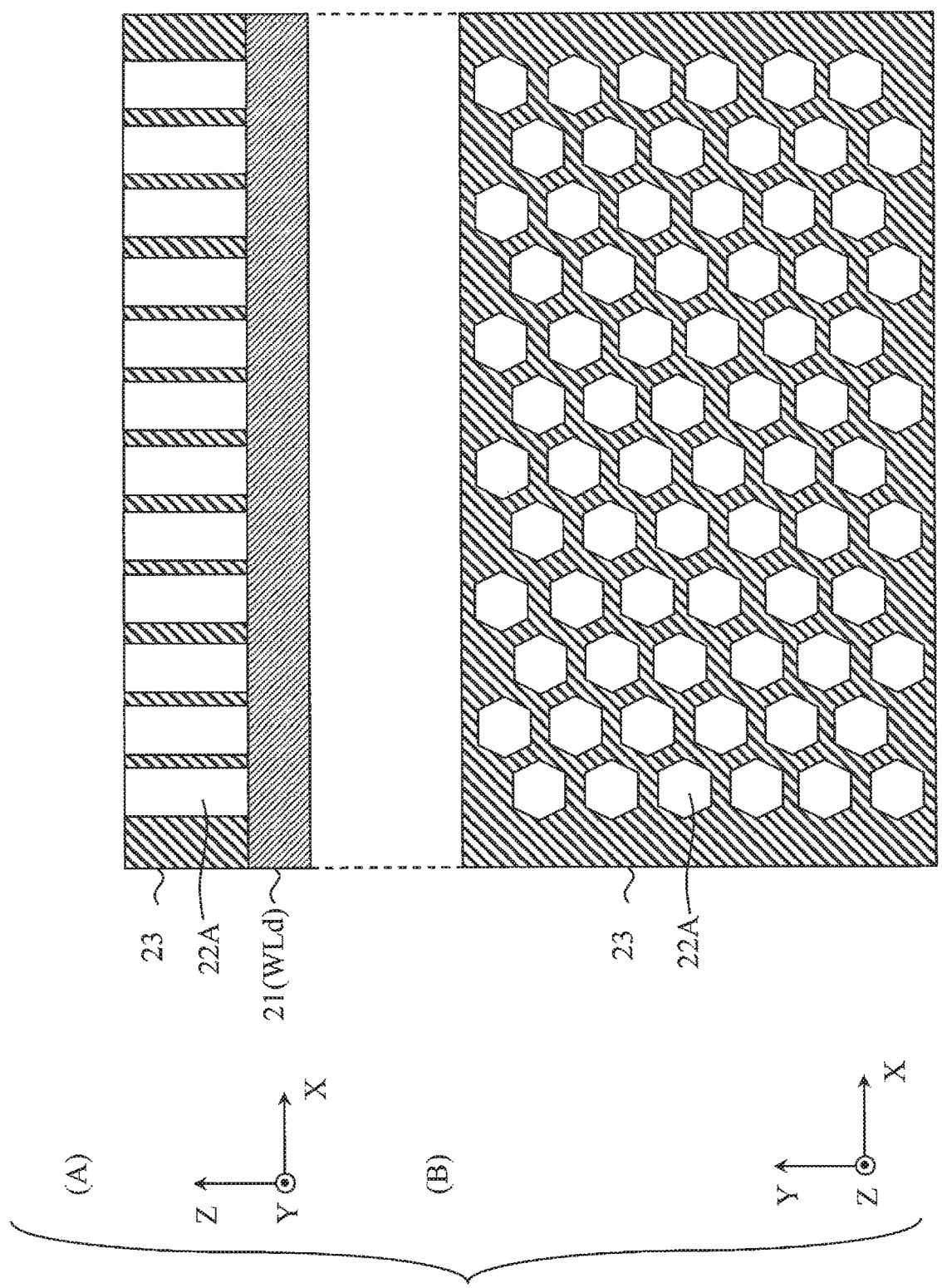
FIG. 18 is a schematic view illustrating a method of manufacturing the memory cell array of the magnetic storage device according to the second embodiment.

Subsequently, as shown in FIG. 18, after the materials 54a that remain on the selector members 22A are removed, an insulator 23 is provided between the selector members 22A. The insulator 23 may be formed by CVD, etc., or by oxidization or nitridization of the surfaces of the selector members 22A. Thereafter, the steps similar to the steps of the first embodiment shown in FIG. 9 are performed, and a plurality of memory cells MC are thereby formed.

This is the end of the manufacturing of the memory cell array 10.

2.3 Effects According to Second Embodiment

According to the second embodiment, etching is performed to a plurality of selector members 22A in accordance with a pattern of a photo mask formed by self-assembling. It is thereby possible to achieve effects similar to those in the first embodiment, even if a material that cannot be easily phase-separated from the insulator 23 at the time of sputtering is selected as a material for the selector members 22A.

3. Other Modifications

The aforementioned first embodiment and second embodiment may have various modifications. In the following, modifications applicable to both of the first and second embodiments will be described.

In the first and second embodiments, the examples in which a plurality of selector members 22 are formed approximately perpendicular along the Z direction are explained; however, the embodiments are not limited to the examples.

FIGS. 19 and 20 are cross-sectional views illustrating a configuration of the memory cell array of the magnetic storage device according to a first modification. FIGS. 19 and 20 partially correspond to FIG. 3 which illustrates the first embodiment, and show the parts corresponding to the word lines WLd, the selectors SELd, and the magnetoresistive effect elements MTJd in the memory cell array 10.

As shown in FIG. 19, a plurality of selector members 22B may be formed in tapered shapes in such a manner that the cross sections thereof in the XY plane decrease from the lower ends toward the upper ends thereof. As shown in FIG. 20, a plurality of selector members 22C may be formed in reversed tapered shapes in such a manner that the cross sections thereof in the XY plane increase from the lower ends toward the upper ends thereof. Such configurations of the selector members 22B and 22C may be achieved, for example, by the conditions of sputtering in the first embodiment, and by the conditions of etching in the second embodiment.

Regardless of the tapered or reversed tapered shapes thereof, the side surfaces of the selector members 22B and 22C are covered by the insulator 23. For this reason, the selector members 22B or 22C are insulated from each other, and a leak of a current between the memory cells MC can be suppressed. It is thus possible to achieve effects equivalent to those in the first and second embodiments in the first modification.

In the first and second embodiments, the selector members 22 are completely isolated from each other; however, the embodiments are not limited thereto. The selector members 22 may be coupled to each other at the lower ends thereof.

FIG. 21 is a cross-sectional view illustrating a configuration of the memory cell array of the magnetic storage device according to a second modification. FIG. 21 partially corresponds to FIG. 3 illustrating the first embodiment, and shows the parts corresponding to the word lines WLd, the selectors SELd, and the magnetoresistive effect elements MTJd in the memory cell array 10.

As shown in FIG. 21, a selector member 22D_2 is provided on the conductors 21, across the XY plane. And selector members 22D_1 may be coupled to each other by the selector member 22D_2, across the XY plane. Such a configuration may be formed when the lower ends of the tapered selector members 22D_1 are in contact with the selector member 22D_2, as described in the first modification with reference to FIG. 19.

In this case, the selectors SELd of two neighboring memory cells MC are coupled to each other via the selector member 22D_2. For this reason, a current flowing in a selected one of the two neighboring memory cells MC may leak to a non-selected one of the neighboring memory cells MC through the selector member 22D_2. However, in this case, the thickness of the selector member 22D_2 in the Z direction is designed so that it can be ignored with respect to the thickness of the selector member 22D_1. It is thereby possible to maintain the resistance value between two memory cells MC at a magnitude to the extent that these memory cells MC are insulated from each other. Accordingly, even when the selector members 22D_1 are coupled to each other in two neighboring memory cells MC by the selector member 22D_2, it is possible to suppress a leak of current to a non-selected memory cell MC and to reduce load of the manufacturing process.

In the foregoing first and second embodiments, a case where a magnetoresistive effect element MTJ is arranged above a selector SEL; however, the embodiments are not limited thereto. For example, the memory cells MC may have a configuration in which a selector SEL is arranged above a magnetoresistive effect element MTJ.

The foregoing first and second embodiments describe the case where the magnetoresistive effect elements MTJ are of a bottom-free type in which a storage layer SL is provided below a reference layer RL; however, the magnetoresistive effect elements MTJ may be of a top-free type in which a storage layer SL is provided above a reference layer RL.

FIG. 22 is a cross-sectional view illustrating a configuration of the magnetoresistive effect element of the magnetic storage device according to a third modification. FIG. 22 corresponds to FIG. 5 illustrating the first embodiment. As shown in FIG. 22, in the element 25A, a plurality of materials, for example, the ferromagnetic material 45, the non-ferromagnetic material 44, the ferromagnetic material 43, the non-ferromagnetic material 42, and the ferromagnetic material 41 are stacked in this order, from the word line WLd side toward the bit line BL side (in the direction of the Z axis). In the element 30A, a plurality of materials, for example, the ferromagnetic material 45, the non-ferromagnetic material 44, the ferromagnetic material 43, the non-ferromagnetic material 42, and the ferromagnetic material 41 are stacked in this order, from the bit line BL side toward the word line WLu side (in the direction of the Z axis).

Figure 23:
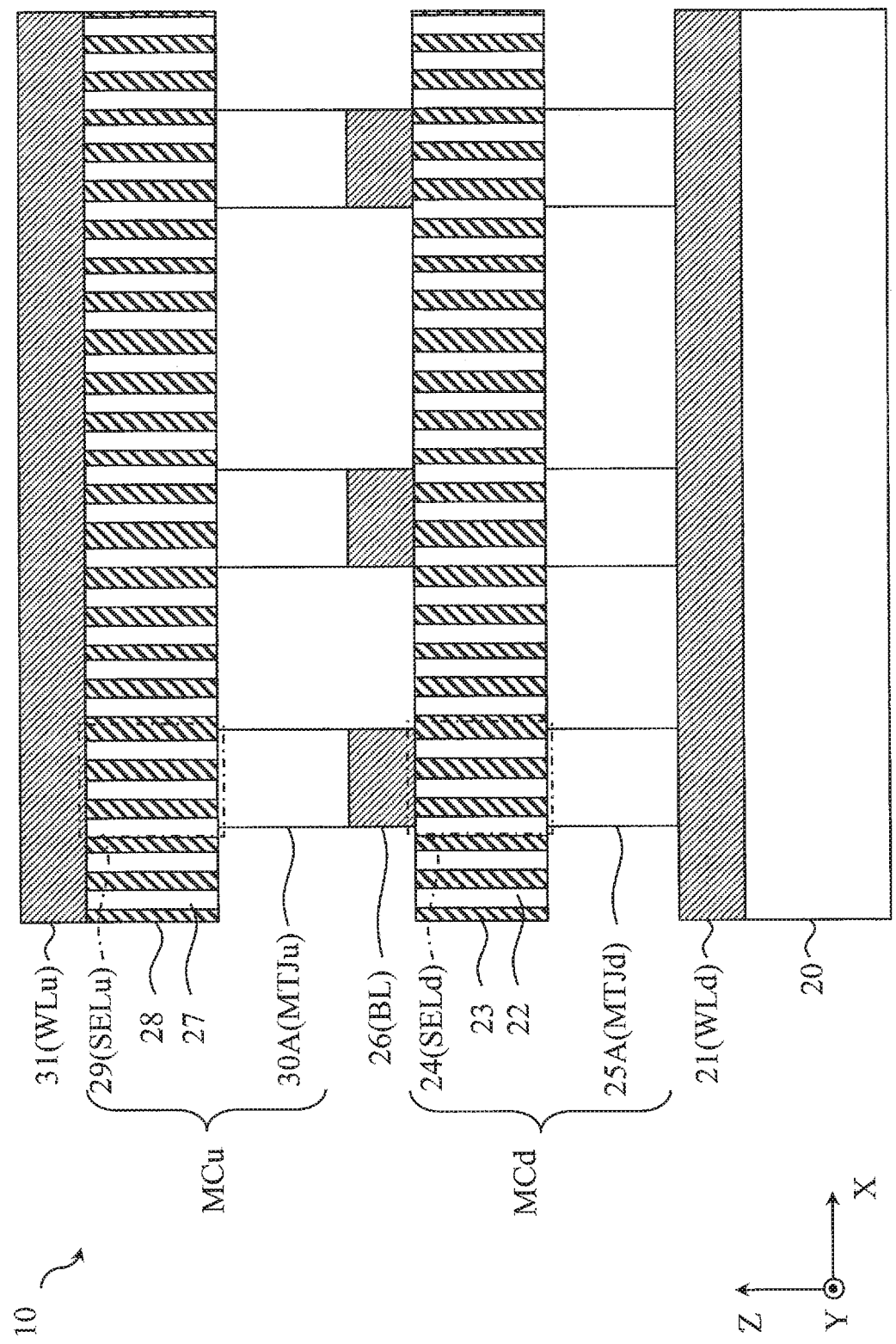
FIG. 23 is a cross-sectional view illustrating another configuration of the memory cell array of the magnetic storage device according to the third modification.

If configured as described above, a current constriction effect that is described in the first embodiment can be achieved by providing the elements 24 and 29 above the elements 25A and 30A, respectively. FIG. 23 is a cross-sectional view illustrating a configuration of the memory cell array of the magnetic storage device according to the third modification. FIG. 23 corresponds to FIG. 3 illustrating the first embodiment.

As shown in FIG. 23, the elements 25A are provided on the upper surfaces of each of the conductors 21 that are arranged along the Y direction. In other words, the plurality of elements 25A arranged in line along the X direction are coupled to one conductor 21 in common. Between the elements 25A, a not-shown insulator, for example, is provided up to the same height as the plurality of elements 25A. On the upper surfaces of the plurality of elements 25A and of the not-shown insulator, a plurality of selector members 22 are formed across the XY plane. Each of the selector members 22 is formed in a pillar shape along the Z direction, and an insulator 23 is formed on the side surface of each selector member. The elements 24 are thus formed.

A plurality of elements 30A are arranged on the upper surfaces of each of the conductors 26 arranged in line along the Y direction, respectively. In other words, the plurality of elements 30A arranged in line along the Y direction are coupled to one conductor 26 in common. Between the elements 30A, a not-shown insulator, for example, is provided up to the same height as the plurality of elements 30A. On the upper surfaces of the plurality of elements 30A and of the not-shown insulator, a plurality of selector members 27 are formed across the XY plane. Each of the selector members 27 is formed in a pillar shape along the Z direction, and an insulator 28 is formed on the side surface of each selector member. The elements 29 are thus formed.

As described above, it is possible to supply a current from the selector members 22 and 27 directly into the ferromagnetic material 41 in the elements 25A and 30A through the constricted path by forming the elements 25A and 30A below the elements 24 and 29, respectively. At this time, in one memory cell MC, it is desirable that the first end of each of the selector members 22 of the selector SEL (e.g., the element 24) is in contact with the ferromagnetic material 41 in a mutually independent manner. With the above-described configuration, when a current flows in the storage layer SL of each element 25A (30A) via the selector members 22 (27), the current flowing in the storage layer SL is integrated into a place where the element 25A (30A) is coupled to the selector members 22 (27). For this reason, a reduction in a write current due to a current constriction effect can be expected.

Since the elements 24 and 29 are formed after the elements 25A and 30A are formed, it is possible to suppress damage due to a gas used for forming the elements 24 and 29 to the elements 25A and 30A.

The magnetoresistive effect elements MTJ described in the first and second embodiments are perpendicular magnetization MTJ elements, but the MTJ elements are not limited thereto; they may be in-plane magnetization MTJ elements having magnetic anisotropy in parallel to a film surface.

Herein, an MRAM that stores data using magnetoresistive effect elements (magnetic tunnel junction (MTJ) elements) as resistance change elements has been described as an example in the foregoing embodiments and modifications; however, the storage device is not limited thereto. The foregoing embodiments are applicable to any memory in general having a storage element that senses a resistance difference between resistance change elements by converting the resistance difference into a current difference or a voltage difference. In other words, the embodiments are applicable to a semiconductor storage device including resistance change elements that can read data stored by a resistance change that is caused by application of a current or a voltage, or stored by converting the resistance difference involved with the resistance change into a current difference or a voltage difference.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor storage device comprising:
a first memory cell and a second memory cell, each including a switching element and a resistance change element coupled to the switching element, and the first memory cell and the second memory cell being adjacent to each other;
a non-active member having a switching function between the switching element of the first memory cell and the switching element of the second memory cell; and
an insulator which covers at least one of an upper surface or a lower surface of the non-active member, a side surface of the non-active member, a side surface of the switching element of the first memory cell, and a side surface of the switching element of the second memory cell.

2. The device of claim 1, wherein
each of the switching element of the first memory cell and the switching element of the second memory cell includes at least one active member having a switching function that is physically isolated from the non-active member, with the insulator being interposed therebetween.

3. The device of claim 2, wherein
the active member has a cross-sectional area along a coupling surface, where the switching element and the resistance change element are coupled, that is smaller than a cross-sectional area of the resistance change element.

4. The device of claim 2, further comprising a seed member on a lower surface of the active member.

5. The device of claim 2, wherein
the active member functions as the switching element between two terminals.

6. The device of claim 5, wherein
the active member includes at least two elements selected from germanium (Ge), antimony (Sb), tellurium (Te), titanium (Ti), arsenic (As), indium (In), and bismuth (Bi).

7. The device of claim 5, wherein
the active member includes an oxide of at least one element selected from titanium (Ti), vanadium (V), chromium (Cr), niobium (Nb), molybdenum (Mo), hafnium (Hf), and tungsten (W).

8. The device of claim 2, wherein
the resistance change element includes a magnetoresistive effect element that includes a first ferromagnetic material, a second ferromagnetic material, and a non-ferromagnetic material between the first ferromagnetic material and the second ferromagnetic material.

9. The device of claim 8, wherein
the active member is in contact with the first ferromagnetic material.

10. A semiconductor storage device comprising:
a first memory cell which includes
  a switching element that includes a first active member and a second active member, each having a pillar shape and a switching function, and
  a resistance change element having a first end coupled to each of the first active member and the second active member; and
an insulator that covers a side surface of the first active member and a side surface of the second active member.

11. The device of claim 10, wherein
a cross-sectional area of each of the first active member and the second active member is smaller than a cross-sectional area of the resistance change element, the cross-sectional areas being along a coupling surface where the switching element is coupled to the resistance change element.

12. The device of claim 10, further comprising:
a second memory cell which includes the switching element and the resistance change element and which is adjacent to the first memory cell; and
a pillar-shaped non-active member having the switching function between the switching element of the first memory cell and the switching element of the second memory cell, wherein
the insulator covers at least one of an upper surface or a lower surface of the non-active member, and a side surface of the non-active member.

13. The semiconductor storage device according to claim 10, further comprising:
a first seed member on a lower surface of the first active member; and
a second seed member on a lower surface of the second active member.

14. The device of claim 10, wherein
each of the first active member and the second active member functions as the switching element between two terminals.

15. The device of claim 14, wherein
each of the first active member and the second active member includes at least two elements selected from germanium (Ge), antimony (Sb), tellurium (Te), titanium (Ti), arsenic (As), indium (In), and bismuth (Bi).

16. The device of claim 14, wherein
each of the first active member and the second active member includes an oxide of at least one element selected from titanium (Ti), vanadium (V), chromium (Cr), niobium (Nb), molybdenum (Mo), hafnium (Hf), and tungsten (W).

17. The device of claim 10, wherein
the resistance change element includes a magnetoresistive effect element.

18. The device of claim 17, wherein
the first active member and the second active member are coupled in common to the first end of the resistance change element via a mutually-different conductive path.

19. The device of claim 17, wherein
the resistance change element includes a first ferromagnetic material in the first end of the resistance change element, a second ferromagnetic material, and a non-ferromagnetic material between the first ferromagnetic material and the second ferromagnetic material,
the first active member is in contact with the first ferromagnetic material in a first portion of the first end of the resistance change element, and
the second active member is in contact with the first ferromagnetic material in a second portion of the first end of the resistance change element, the second portion being different from the first portion.

* * * * *